(12) United States Patent
Suzuki et al.

(10) Patent No.: US 6,768,124 B2
(45) Date of Patent: *Jul. 27, 2004

(54) RETICLE-FOCUS DETECTOR, AND CHARGED-PARTICLE-BEAM MICROLITHOGRAPHY APPARATUS AND METHODS COMPRISING SAME

(75) Inventors: Kazuaki Suzuki, Tokyo (JP); Mikio Ushijima, Kumagaya (JP)

(73) Assignee: Nikon Corporation, Tokyo (JP)

( * ) Notice: Subject to any disclaimer, the term of this patent is extended or adjusted under 35 U.S.C. 154(b) by 382 days.

This patent is subject to a terminal disclaimer.

(21) Appl. No.: 09/828,300

(22) Filed: Apr. 6, 2001

(65) Prior Publication Data

US 2002/0000524 A1 Jan. 3, 2002

Related U.S. Application Data

(63) Continuation-in-part of application No. 09/694,089, filed on Oct. 19, 2000.

(30) Foreign Application Priority Data

Apr. 6, 2000 (JP) .................................... 2000-104626

(51) Int. Cl.[7] ............................ G03F 9/00; G01B 11/00
(52) U.S. Cl. ............................... 250/492.2; 250/492.3; 250/491.1; 250/494.1; 250/396 R; 250/397
(58) Field of Search .................... 250/492.2, 492.3, 250/491.1, 494.1, 396 R, 397

(56) References Cited

U.S. PATENT DOCUMENTS

| 4,558,949 A | * 12/1985 | Uehara et al. .......... 356/139.07 |
| 5,448,332 A | 9/1995 | Sakakibara et al. ........... 355/53 |
| 5,796,467 A | 8/1998 | Suzuki ....................... 355/53 |

FOREIGN PATENT DOCUMENTS

| JP | 08-064506 | 3/1996 |
| JP | 56-42205 | 4/2001 |

* cited by examiner

Primary Examiner—Nikita Wells
(74) Attorney, Agent, or Firm—Klarquist Sparkman, LLP

(57) ABSTRACT

Due to its lack of appreciable thickness, the reticle used in charged-particle-beam (CPB) microlithography is prone to bending and flexing, causing instability in reticle axial height position relative to the projection-lens system, with consequent errors in image focus, rotation and magnification. Apparatus and methods are disclosed for monitoring changes in axial height position of the reticle, to facilitate making compensatory changes. Representative apparatus include a device for detecting the axial height position of the reticle. The device produces one or more beams of light (IR to visible) to strike the reticle at an oblique angle of incidence, detects light reflected from the reticle surface, and detects lateral shifts of the reflected light as received by a height detector. Hence, reticle focus is detected easily and in real time. Multiple detection beams can be used, thereby allowing detection of both axial height position and inclination of the reticle with high accuracy. Reticle-position data can be used to regulate one or more parameters of exposure and/or axial position of the reticle or wafer.

52 Claims, 18 Drawing Sheets

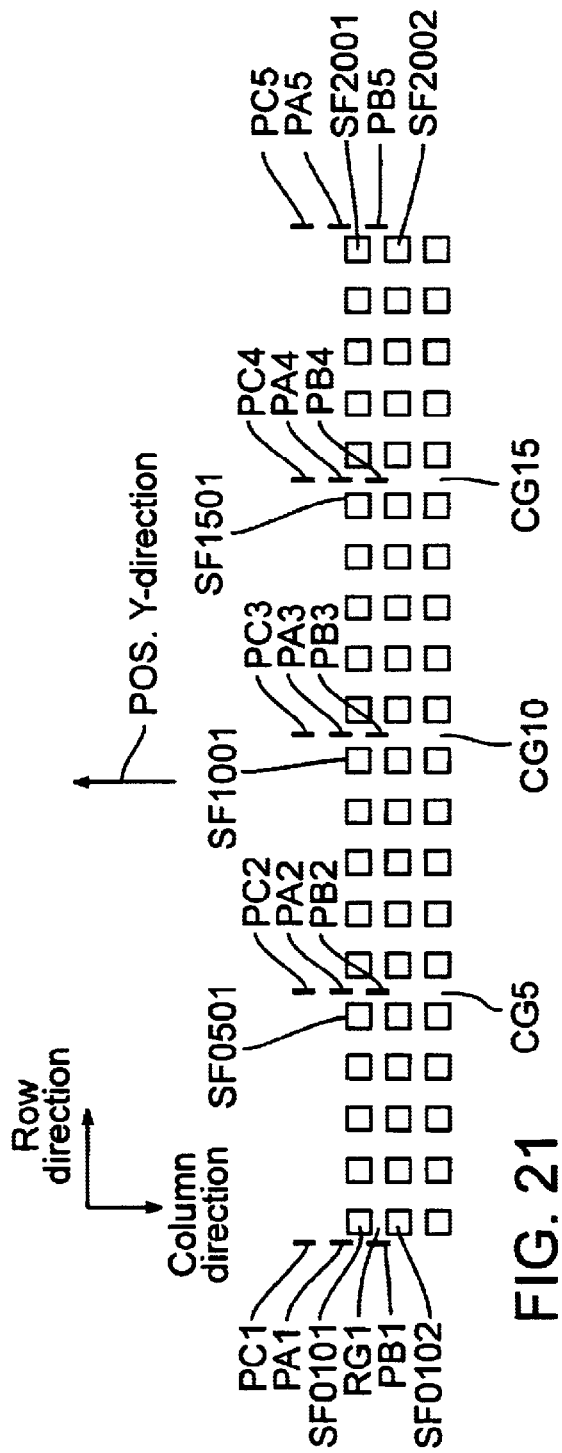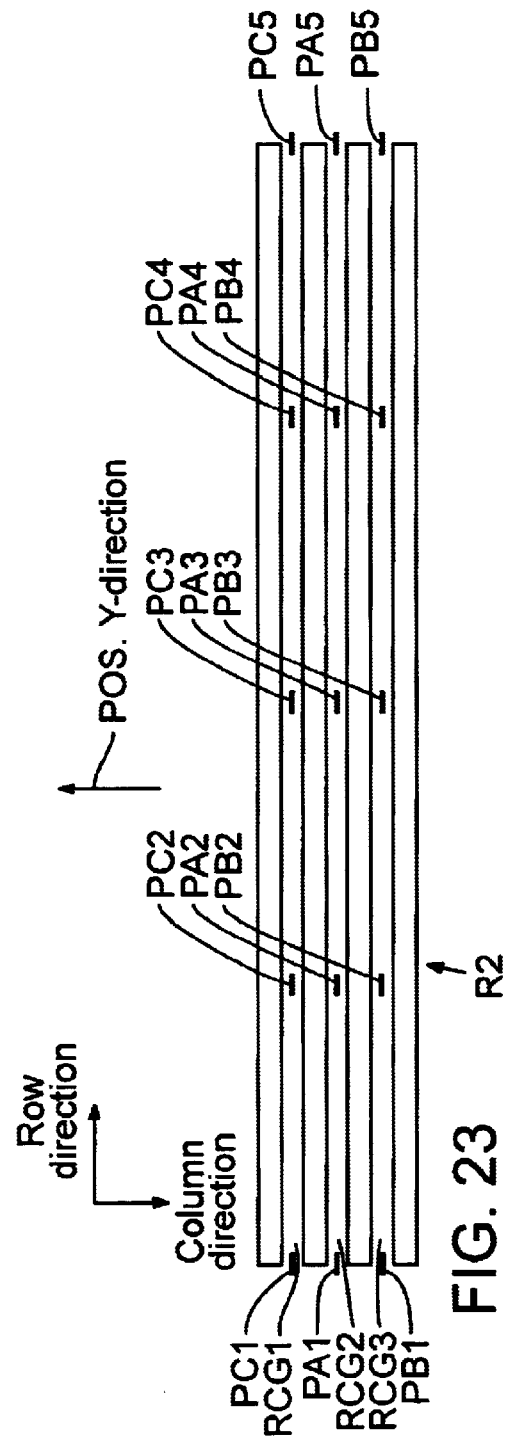

RETICLE-FOCUS DETECTOR, AND CHARGED-PARTICLE-BEAM MICROLITHOGRAPHY APPARATUS AND METHODS COMPRISING SAME

CROSS REFERENCE TO RELATED APPLICATION

This application is a continuation-in-part of co-pending U.S. patent application Ser. No. 09/694,089, filed on Oct. 19, 2000.

FIELD OF THE INVENTION

This invention pertains to microlithography (projection-transfer of a pattern, defined by a reticle or mask, to a suitable substrate using an energy beam). Microlithography is a key technology used in the manufacture of microelectronic devices (e.g., semiconductor integrated circuits), displays, and the like. More specifically, the invention pertains to microlithography performed using a charged particle beam such as an electron beam or ion beam. Even more specifically, the invention pertains to detecting and adjusting the axial height position of the reticle ("reticle focus") relative to a projection-lens system used to project an image of an illuminated region of the reticle onto the substrate.

BACKGROUND OF THE INVENTION

Several techniques currently are used to perform charged-particle-beam (CPB) microlithography. One conventional technique is the so-called cell projection or character projection, in which a portion of a pattern that is repeated many times in the pattern is defined on a reticle. The reticle includes an arrangement of beam-transmissive regions and beam-blocking regions that, as an illumination beam passes through the reticle, forms a "patterned beam" or "imaging beam." An example is a reticle defining a highly repeated portion of an overall pattern for a memory chip. To expose a single die on a wafer or other substrate, the reticle is exposed many times, each time at a different location in the die so as to re-form the entire pattern contiguously on the die. Unique portions of the die pattern (i.e., portions that are not composed of repetitive pattern-portion units and that typically are located mainly at the periphery of the die) can be exposed using a variable-shaped beam, wherein a charged particle beam of a desired size and shape is obtained by selectively blocking portions of the beam from propagating to the substrate. These techniques are described, for example, in Rai-Choudhury (ed.), *Handbook of Microlithography, Micromachining, and Microfabrication*, Vol. 1, SPIE Press, 1997, p. 184, §2.5.6).

In the cell projection technique summarized above, each of the highly repeated portions exposed per single "shot" of the beam typically has an area of approximately (5 µm) square. Hence, hundreds to thousands of shots are required to expose a single die, which adversely affects throughput greatly. As the size and density of microelectronic devices has continued to increase, throughput tends to decrease progressively.

Accordingly, considerable interest lies in developing CPB microlithography methods and apparatus that can achieve higher throughput. One possible technique is to expose the entire die pattern from a reticle in a single shot. Unfortunately, this technique requires enormous CPB optical systems that are extremely difficult and expensive to manufacture, that exhibit excessive aberrations (especially off-axis), and that are extremely difficult to provide with a reticle (CPB reticles of the required size are extremely difficult or impossible to fabricate using conventional methods). Consequently, development has progressed toward development of systems that do not expose the entire reticle pattern in one shot, but rather expose sequential regions of the pattern in a stepping or scanning manner.

Typically, in these methods, a highly accelerated charged particle beam is used to improve resolution and reduce space-charge effects. Unfortunately, highly accelerated charged particle beams exhibit problems such as excessive reticle heating by absorbed particles of the beam. Such heating causes reticle deformation, which causes deformations of the pattern being transferred to the substrate.

To alleviate this problem, a scattering-contrast technique is used in which no actual charged-particle absorption occurs in the reticle. Rather, a scattering aperture is used, wherein the degree of charged-particle blocking by the scattering aperture varies with differences in the scattering angle of the particles, thereby generating contrast. Suitable reticles include scattering-stencil reticles (in which a pattern is defined by a corresponding pattern of apertures in a particle-scattering membrane), and scattering-membrane reticles (in which a pattern is defined by a corresponding pattern of particle-scattering bodies arranged on a particle-transmissive membrane). In any event, substantially all reticles used for CPB microlithography are reinforced structurally by "struts" extending between subfields or other exposure units of the reticle.

Unfortunately, whenever CPB microlithographic pattern transfer is performed using methods as described above, problems of pattern-image defocus (blur), magnification deviations, and image rotation tend to occur at levels exceeding specifications. The respective magnitudes of these problems vary in repeated exposure experiments using the same reticle. As a result, yields of microelectronic devices drop to unacceptable levels and manufacturing costs are increased.

One proposed method for achieving accurate correction of positional relationships between the reticle and the projection-optical system is disclosed in U.S. Pat. No. 5,796,467. According to that patent, multiple exposures are performed using a scanning type CPB microlithography apparatus. During the scanning exposures, the reticle and wafer are moved in mutually opposite directions. The optimal image plane variation obtained from the exposures is stored in a memory as a variation of the positional relationship between the reticle and the projection-optical system. An actual exposure is performed while making a correction according to the coordinates in the scanning direction. Unfortunately, results obtained using that method were not entirely satisfactory.

SUMMARY OF THE INVENTION

In view of the shortcomings of the prior art as summarized above, an object of the present invention is to provide charged-particle-beam (CPB) microlithography apparatus and methods that achieve detection of the axial height position of the reticle in a manner resulting in reduced defocus (blur) of the pattern image.

To such end, and according to a first aspect of the invention, CPB microlithography apparatus are provided, of which a representative embodiment comprises an illumination-optical system, a projection-lens system, and a reticle-focus-detection device (i.e., a device for detecting the axial height position of the reticle). The illumination-optical system is situated and configured to illuminate a region of a pattern-defining reticle with a charged-particle illumination beam passing through the illumination-optical system. The projection-optical system is situated and configured to projection-transfer an image of the illuminated region of the reticle onto a corresponding region of a sensitive substrate using an imaging beam passing through the projection-optical system. The reticle-focus-detection device is situated and configured to detect an axial height position of the reticle relative to the projection-lens system. The reticle-focus-detection device can be used to detect an axial height position of a stencil reticle or a scattering-membrane reticle relative to the projection-lens system.

Compared to a conventional apparatus with which exposure is performed after determining a correction of reticle position relative to the projection-lens system, an apparatus according to the invention as summarized above can provide real-time data on reticle axial height position relative to the projection-lens system. Hence, higher-accuracy projection exposure of the reticle pattern onto the substrate can be performed with high precision.

The reticle-focus-detection device comprises a focus-detection-beam source situated and configured to produce a focus-detection light beam (desirably IR to visible) and to direct the focus-detection beam onto a surface of the reticle such that the focus-detection beam is incident on the reticle at an oblique angle of incidence (i.e., an incidence angle other than 0°). The device also includes a height detector situated and configured to detect light, of the focus-detection beam, reflected from the reticle surface and to produce a corresponding focus-detection (height-detection) signal. In this context, the reticle can be of a type including a reticle membrane and support struts extending from non-pattern-defining regions of the reticle membrane. With such a reticle, the focus-detection-beam source can be configured to produce multiple focus-detection light beamlets directed at the reticle surface in a manner in which the focus-detection light beamlets are incident on the non-pattern-defining regions of the reticle membrane.

The reticle-focus-beam source can be configured to direct the focus-detection beamlets to the reticle, and the height detector can be configured to produce the focus-detection signal, only whenever the non-pattern-defining regions of the reticle membrane are being illuminated by the focus-detection beamlets. In this manner, by obtaining a focus-detection signal in synchrony with irradiation of non-pattern-defining regions of the reticle (e.g., membrane regions at which the support struts are located), an accurate height-detection (focus-detection) signal is obtained without interference generated by light reflected from apertures in the membrane.

The height detector desirably comprises a light-receiving surface including a light sensor. In such an instance, the light sensor can be configured to measure a lateral displacement of the focus-detection light beam on the light-receiving surface. For example, the light sensor can be a one-dimensional light-sensor array, a two-dimensional light-sensor array, or a point-sensitive detector (PSD), wherein a plurality of these sensors is arranged on the light-receiving surface.

For exposure, the reticle desirably is mounted to a reticle stage and the substrate desirably is mounted to a substrate stage. The reticle stage and substrate stage usually are movable in opposite directions during exposure of the reticle pattern onto the substrate. With such a configuration, the focus-detection-beam source can be configured to produce multiple focus-detection light beamlets directed at the reticle surface. Use of multiple beamlets allows measurements to be made simultaneously at multiple locations on the reticle. This allows detection not only of axial height position of the reticle but also of inclination of the reticle relative to an optical axis of the projection-lens system. The beamlets can be incident on the reticle from an incidence direction that is perpendicular to a scanning direction of the reticle stage.

According to another aspect of the invention, methods are provided for performing projection-transfer of a pattern, defined on a reticle, to a sensitive substrate using a charged particle beam. A region of the reticle is illuminated with a charged-particle illumination beam to produce an imaging beam, and the imaging beam is directed to the substrate. The illumination beam and imaging beam pass through a CPB optical system. To detect a focus condition (axial height condition) of the reticle, a focus-detection beam of light is provided, directed at an oblique angle of incidence to a surface of the reticle to produce a reflected beam. The reflected beam is detected using a height detector configured to produce a corresponding height-detection signal from the detected light. The height-detection signal is processed to produce data concerning an axial height position of the reticle relative to the CPB optical system. The reticle typically comprises a reticle membrane and support struts extending from non-pattern-defining regions of the reticle membrane. In such an instance, multiple focus-detection beamlets can be directed at the reticle surface in a manner in which the beamlets are incident on the non-pattern-defining regions of the reticle membrane.

Another embodiment of a CPB microlithography apparatus according to the invention comprises an illumination system, a projection system, and a reticle-focus-detection device. The illumination system is situated and configured to illuminate a region of a pattern-defining reticle with a charged-particle illumination beam passing through the illumination system. The projection system is situated and configured to projection-transfer an image of the illuminated region of the reticle onto a corresponding region of a sensitive substrate using an imaging beam passing through the projection system. The reticle-focus-detection device is situated and configured to detect an axial height position of the reticle relative to the projection system. The reticle-focus-detection device comprises a focus-detection-beam source and a height detector. The focus-detection-beam source is situated and configured to produce a focus-detection light beam and to direct the focus-detection beam onto a surface of the reticle such that the focus-detection beam is incident on the reticle at an oblique angle of incidence. The height detector is situated and configured to detect light, of the focus-detection beam, reflected from the reticle surface and to produce a corresponding focus-detection signal. The height detector comprises a light-receiving surface and is configured to measure a lateral displacement of the focus-detection light beam on the light-receiving surface.

The height detector can comprise a light sensor selected from the group consisting of one-dimensional light-sensor arrays, two-dimensional light-sensor arrays, and point-sensitive detectors.

The focus-detection-beam source can be configured to produce, from the focus-detection light beam, multiple focus-detection beamlets, and to direct the focus-detection beamlets onto respective height-detection loci on the surface of the reticle. In this instance, the reticle can comprise support struts having respective edge surfaces, wherein the height-detection loci are located on the edge surfaces of the support struts. The loci can be spaced from each other at an equal locus-spacing interval in a direction perpendicular to a reticle-scanning direction. Alternatively or in addition, the support struts can be spaced from each other at a strut-spacing interval in the reticle-scanning direction, in which instance the locus-spacing interval can be an integral multiple of the strut-spacing interval.

According to another aspect of the invention, reticle-focus-detection devices are provided in the context of CPB microlithography apparatus. The CPB microlithography apparatus typically includes an illumination system and a projection system as summarized above. The reticle-focus-detection device is operable to detect an axial height position of the reticle relative to the projection system. An embodiment of the reticle-focus-detection device comprises a focus-detection-beam source and a height detector. The source is situated and configured to produce multiple separate beamlets of focus-detection light and to direct the beamlets at an oblique angle of incidence onto a surface of the reticle, such that the beamlets are incident at respective height-detection loci on the surface of the reticle. The height detector is situated and configured to detect light of the beamlets reflected from the reticle surface and to produce a corresponding focus-detection signal. The height detector comprises a light-receiving surface including a respective light detector for each beamlet, and each light detector is configured to measure a lateral displacement of the respective beamlet on the light-receiving surface and produce a respective height-encoding signal.

The focus-detection-beam source can be configured to produce at least three beamlets that are incident at respective height-detection loci arranged on the reticle surface relative to an exposure region of the reticle surface that can be illuminated by a corresponding deflection of the illumination beam. In such an instance, the height detector can be configured to produce an aggregate signal from the respective height-encoding signals produced by the respective light detectors for the at least three beamlets. The aggregate signal corresponds to a height measured at a center of the exposure region. The exposure region can include opposing ends each including multiple height-detection loci. In such an instance, the focus-detection beam source can be further configured to produce a respective beamlet for each height-detection locus at each end.

The reticle can comprise support struts having respective edge surfaces. In such an instance, the height detector can be further configured to detect respective beamlets reflected from height-detection loci located on the edge surfaces of the support struts. The loci are spaced from each other at an equal locus-spacing interval in a direction perpendicular to a reticle-scanning direction. The support struts can be spaced from each other at a strut-spacing interval in the reticle-scanning direction. In such an instance, the locus-spacing interval can be an integral multiple of the strut-spacing interval.

Alternatively, the height detector can be configured to detect respective beamlets reflected from height-detection loci located on the edge surfaces of the support struts, wherein the loci are spaced from each other at an equal locus-spacing interval in the reticle-scanning direction. In such an instance, the support struts can be spaced from each other at a strut-spacing interval in a direction perpendicular to the reticle-scanning direction. The locus-spacing interval can be, for example, an integral multiple of the strut-spacing interval or an integral multiple of one-half the strut-spacing interval.

The reticle-focus-detection device can further comprise a processor to which the light detectors of the height detector are connected. The processor is configured to calculate respective heights of the height-detection loci, based on the respective height-encoding signals. The processor can further comprise an interpolating circuit configured to calculate respective interpolated heights of locations situated between flanking height-detection loci. In such an instance, the interpolated heights can be calculated based on the respective height-encoding signals from the flanking height-detection loci. The interpolating circuit can be further configured to calculate respective interpolated heights of locations, situated between flanking height-detection loci, lined up in a direction perpendicular to a reticle-scanning direction. If the reticle is segmented into multiple subfields, then at least one of the locations at which interpolated heights are calculated can be situated adjacent a respective subfield of the reticle.

If the reticle comprises multiple subfields, wherein at least some of the subfields are flanked by respective multiple height-detection loci, then the processor can further comprise a height-determining circuit configured to calculate respective heights of the subfields based on determined heights of the respective flanking height-detection loci. The processor in this instance can further comprise a predicting circuit configured to predict respective heights of subfields lined up in a direction perpendicular to a reticle-scanning direction. The predictions typically are based on the heights of subfields calculated by the height-determining circuit.

The light-receiving surface can constitute a main light-receiving portion of the height detector. In such an instance the main light-receiving portion can be situated so as to receive beamlets reflected from locations, on the reticle surface, at which respective height detections are determined. The height detector can further comprise multiple auxiliary light-receiving portions each situated so as to receive respective beamlets reflected from locations, on the reticle surface, at which respective height detections are to be determined. The auxiliary light-receiving portions can be situated and configured to receive respective beamlets reflected from locations, on the reticle surface, that are displaced in a reticle-scanning direction from locations detected by the main light-receiving portion. In this configuration, a processor desirably is used to calculate respective heights of the height-detection loci, based on the respective height-encoding signals.

The processor can further comprise a direction-determining circuit configured to detect a direction of scanning movement of the reticle. The processor can further include a sensor selector configured to select a respective auxiliary light-receiving portion based on the respective direction of scanning movement of the reticle as detected by the direction-determining circuit.

The reticle-focus-detection device can further comprise a stage-detection device situated and configured to detect a position of the reticle stage. The stage-detection device can be further configured to detect a detection-enable position of the reticle stage and to output an AF-enable signal to the height detector whenever the reticle stage is in the detection-enable position. The height detector can be further configured to produce the focus-detection signals upon receiving the AF-enable signal. The detection-enable position can correspond to a reticle-stage position at which the beamlets are incident on the respective light-receiving loci. If the reticle comprises support struts, then the detection-enable position can correspond to the reticle-stage position at which the beamlets are incident on respective light-receiving loci situated on edge surfaces of the support struts.

According to another aspect of the invention, methods are provided (in the context of performing projection-transfer of a pattern using a charged particle beam) for detecting a focus condition of the reticle. In an embodiment of such a method, a reticle is provided that is segmented into multiple subfields arrayed in a two-dimensional array and separated from one another by support struts. The reticle is mounted on a reticle stage movable at least in a stage-scanning direction. A position of the reticle stage is detected. While the reticle stage is at the detected position, a focus-detection beam of light is directed at an oblique angle of incidence to a surface of the reticle to produce a reflected beam. Light of the reflected focus-detection beam is detected using a height detector configured to produce a corresponding detection signal from the detected light. The detection signal is processed to produce data concerning an axial height position of the reticle relative to the CPB optical system. If the axial height position of the reticle is outside pre-set tolerance limits, then a correction is applied to at least one of the axial height position and the CPB optical system until the axial height position is within the tolerance limits.

The foregoing and additional features and advantages of the invention will be more readily apparent from the following detailed description, which proceeds with reference to the accompanying drawings.

BRIEF DESCRIPTION OF THE DRAWINGS

FIG. 7(A) is a reticle in which individual square subfields (intended to be exposed one at a time) are separated from one another by minor struts, and FIG. 7(B) is a reticle in which the subfields (intended to be exposed in a scanning manner) are extended longitudinally in a beam-deflection direction.

FIG. 12(A) is a reticle in which individual square subfields (intended to be exposed one at a time) are separated from one another by minor struts, and FIG. 12(B) is a reticle in which the subfields (intended to be exposed in a scanning manner) are extended longitudinally in a beam-deflection direction (row direction).

FIG. 21 is similar to FIG. 17 except that, in FIG. 21, the height-detection loci are rotated 90 degrees from the orientations of the respective height-detection loci in FIG. 17.

FIG. 23 is a plan view of a reticle, such as shown in FIG. 9, showing the locations of certain height-detection loci on upstream-facing surfaces of minor row struts, as discussed in connection with the fourth representative embodiment.

DETAILED DESCRIPTION

General Considerations

The invention is based on an analysis of the following problems experienced with the types of membrane reticles summarized above:

(1) Bending of the reticle membrane caused by gravity is greater than bending experienced by a conventional reticle.

(2) Vibration of the reticle in an axial direction is caused by the movements of the reticle stage performed to move the desired region of the reticle pattern within the visual field of the CPB illumination-optical and projection-optical systems.

(3) Especially in the case of pattern-transfer type CPB microlithography apparatus, the demagnification ratio at which projection occurs is kept to values of 1/(several ones) to avoid making the reticle extremely large. As a result, the variation in position of the reticle in the axial direction has an effect on the focusing performance of the image on the wafer that cannot be ignored.

The present invention is based on the discovery that these problems cannot be corrected entirely in a satisfactory manner using correction values measured prior to exposure. Rather, it is necessary to correct positional variations of the reticle in real time during exposure.

In conventional CPB microlithography, stencil-type reticles frequently are used. Typically, the reticle comprises a membrane made of a metal that absorbs the charged particle beam. The membrane, having a thickness of several tens of micrometers, defines openings that, in combination with remaining portions of the membrane, define the pattern. The mechanical rigidity of such a reticle is relatively high. Also, the demagnification of the image as projected normally is 1/(several tens). As a result, the effects of reticle deformation in the axial direction on image focusing on the wafer usually can be ignored, and there is no need to detect reticle focus. The present invention originates in a phenomenon that could not be predicted from this conventional apparatus.

The invention is described below in the context of representative embodiments. However, it will be understood that the invention is not limited to those embodiments.

First Representative Embodiment

Figure 1:
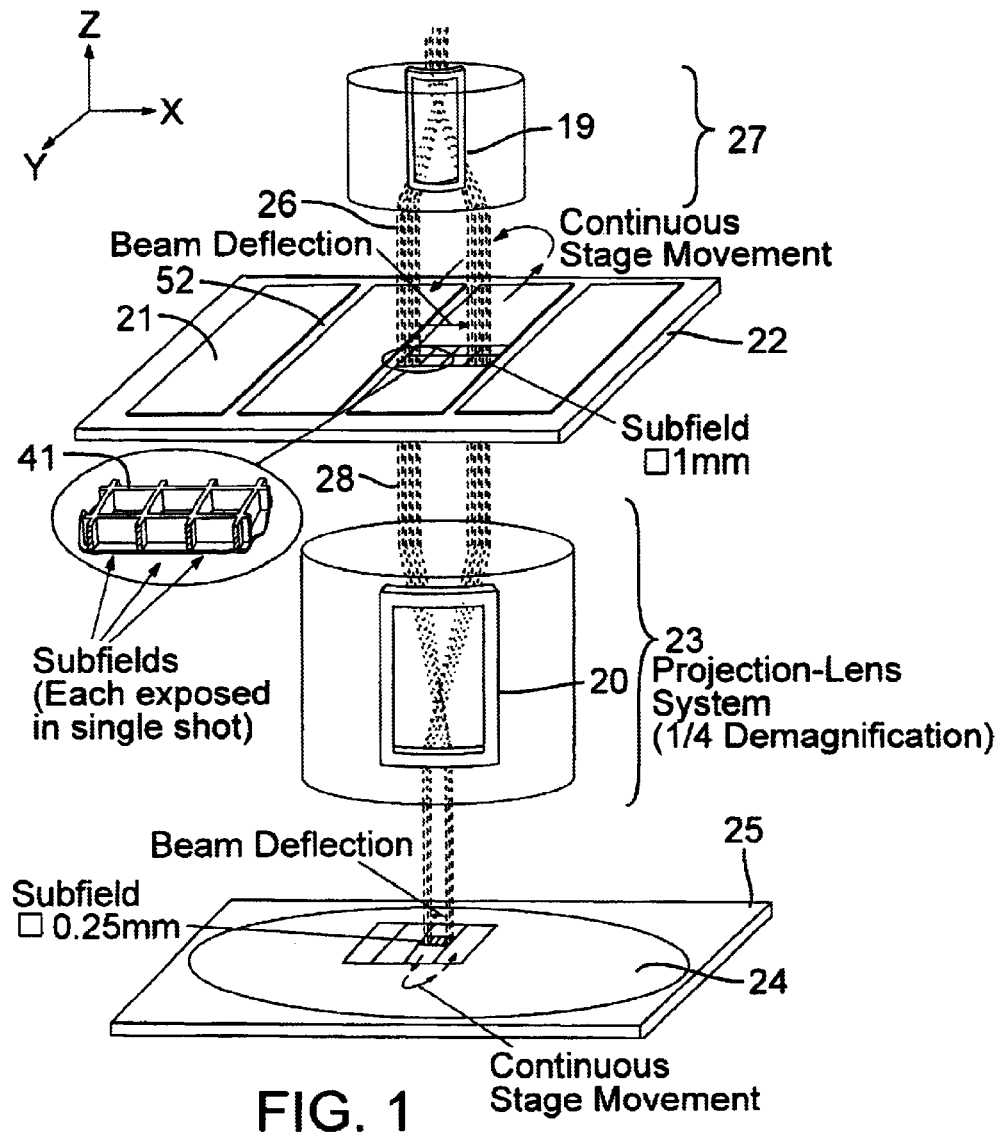
FIG. 1 is an oblique elevational diagram of certain aspects of a charged-particle-beam (CPB) microlithography apparatus, as described in connection with the first representative embodiment.

A CPB microlithography apparatus according to this embodiment is depicted in FIG. 1. This embodiment is described in the context of using an electron beam as an exemplary charged particle beam. However, it will be understood that the general principles readily can be applied to other types of charged particle beams, such as an ion beam.

In FIG. 1, a reticle 21 is mounted on a reticle stage 22 that is movable two dimensions (X- and Y-dimensions). Downstream of the reticle 21, a wafer 24 (constituting a "sensitive," or resist-coated, substrate) is mounted on a wafer stage 25 that also is movable in two dimensions (X- and Y-dimensions). Between the reticle 21 and the wafer 24 is a projection-lens system 23, and upstream of the reticle 21 is an illumination-optical system 27. The illumination-optical system 27 trims an electron beam 26 to a square transverse profile and causes the beam (as an "illumination beam") to strike the reticle 21 perpendicularly to the plane of the reticle 21. On the reticle 21, the pattern region that can be transferred in a single shot is termed a "subfield." The subfield typically has a size of (1 mm) square on the reticle 21. From the reticle 21, the beam passes (as an "imaging beam") through the projection-lens system 23 to the wafer 24. The illumination-optical system 27 and the projection-lens system 23 each include at least one deflector 19, 20, respectively.

Figure 2:
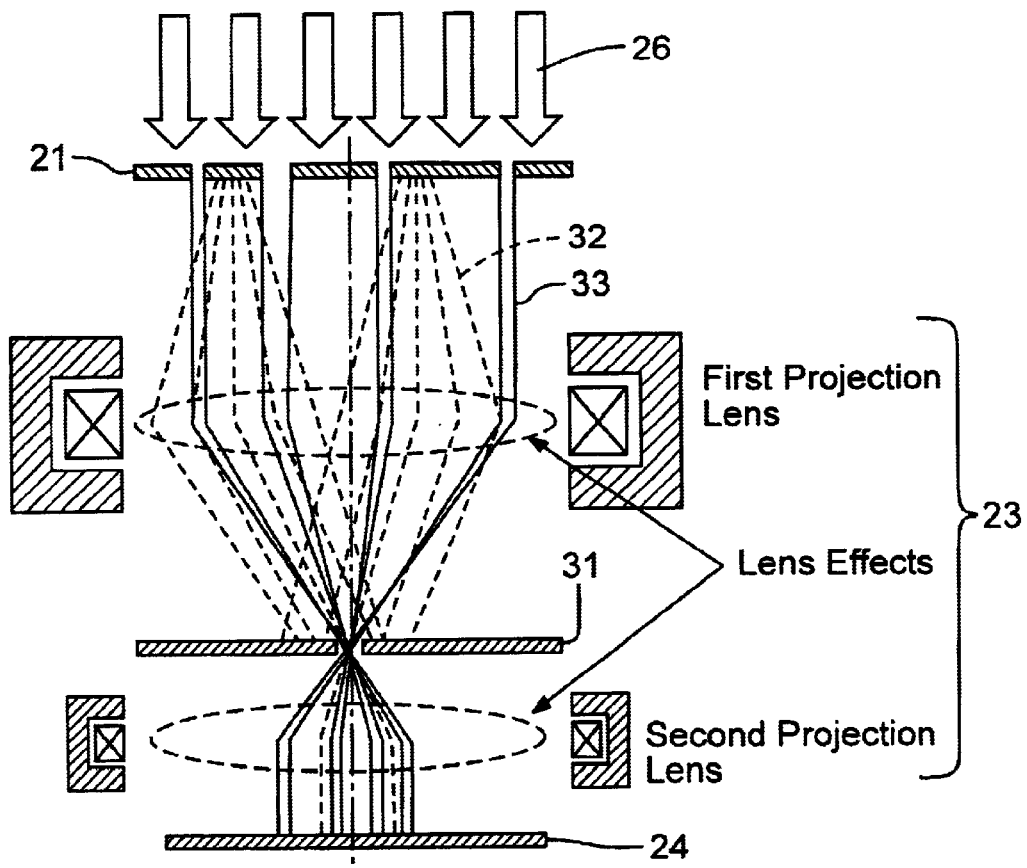
FIG. 2 is an elevational schematic depiction of certain aspects of the projection-lens system and beam trajectories of the apparatus of FIG. 1.

The reticle 21 used in the configuration of FIG. 1 is a "scattering-stencil" reticle in which beam-transmissive apertures are defined in a CPB-scattering membrane material. FIG. 2 depicts the reticle 21 being illuminated from upstream by the electron beam ("illumination beam" 26). The illumination beam passes readily through the apertures in the reticle 21 but is scattered by passage through the membrane portion of the reticle. The scattered electrons 32 (indicated by broken lines) in the resulting "imaging beam" are blocked by a scattering aperture 31 in the projection-lens system 23 from propagating further downstream to the surface of the wafer 24. Electrons (indicated by solid lines in the figure) passing freely through the apertures in the reticle 21 propagate as the imaging beam to the surface of the wafer 24 and expose a resist applied to the surface of the wafer 24. By way of example, if the demagnification ratio of the projection-lens system 23 is ¼ and the size of a subfield on the reticle 21 is (1 mm) square, then the size of a corresponding subfield on the wafer 24 is (250 µm) square.

Figure 3:
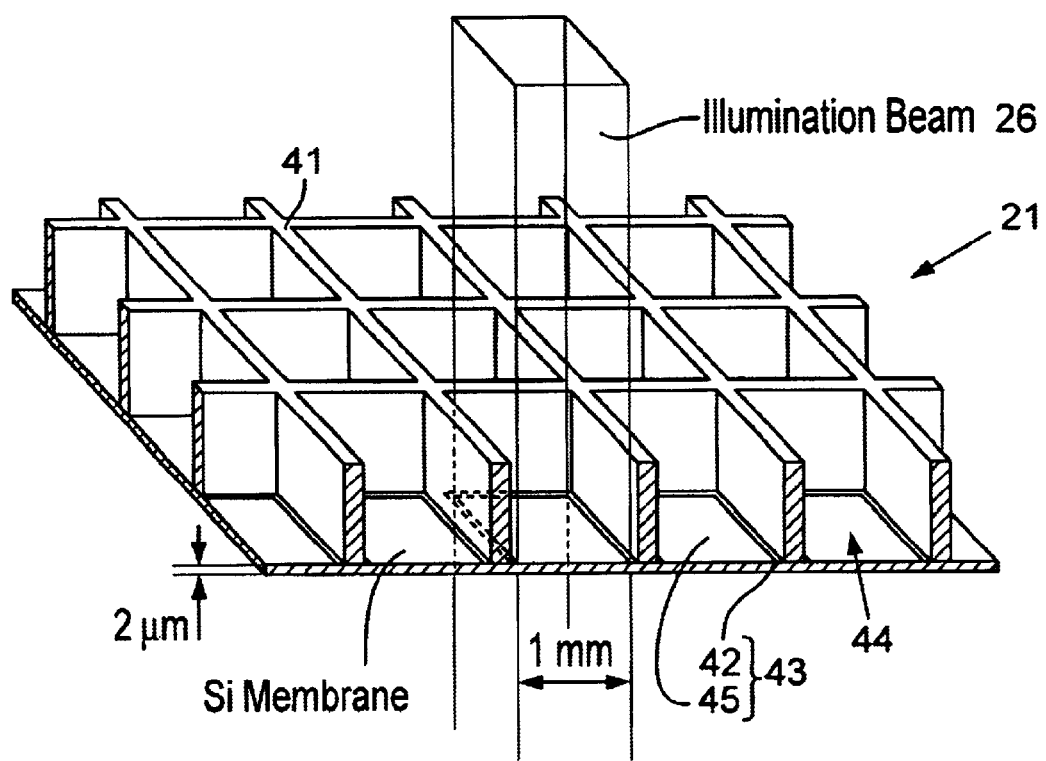
FIG. 3 is an oblique elevational diagram of certain aspects of a reticle as used with the embodiment of FIG. 1.

Returning to FIG. 1, the illumination beam 26 illuminating the reticle 21 is moved laterally (to the left and right in the figure) in an appropriate manner by the deflector 19 of the illumination-optical system 27. As shown in FIG. 1 (see also FIG. 3), the reticle 21 includes a grid structure formed of "minor struts" 41. As the illumination beam 26 is illuminating a subfield on the reticle 21, the illumination beam 26 is trimmed and blanked appropriately to illuminate the membranous portion 43 of a subfield 44 but not the surrounding minor struts 41. The membranous portion 43 of the subfield includes the respective patterned region 45 surrounded by a respective non-patterned skirt 42. During exposure of a subfield 44, the respective skirt 42 prevents beam-shape errors and blanking-timing errors of the illumination beam 26 from adversely affecting the transfer-exposure of the subfield to the wafer 24.

The illumination beam 26 successively illuminates the respective patterned regions 45 of a row of subfields on the reticle 21 by appropriate lateral beam deflections within a controllable range. The corresponding imaging ("patterned") beam 28 is transferred onto the wafer surface by the projection-lens system 23. For each subfield in the row being exposed, the actual respective transfer position on the wafer is adjusted finely using the deflector 20 inside the projection-lens system 23, so that the portions corresponding to the minor struts 41 and skirts 42 on the reticle do not appear on the wafer 24. By carefully controlling operation of the deflector 20 in the projection-lens system 23 with respective movements of the reticle stage 22 and wafer stage 25 (in the figure, in the forward and rearward directions perpendicular to the beam-deflection directions), the individual subfield images as formed on the wafer 24 are "stitched" together to form a contiguous two-dimensional pattern on the wafer. After all subfields in a row are exposed (taking into account the limitations imposed by the size of the reticle 21 and respective ranges of stage movement), the reticle stage 22 and wafer stage 25 move in mutually opposite directions along a dimension perpendicular to the directions of stage movement during exposure to position the next row of subfields for exposure.

Figure 4:
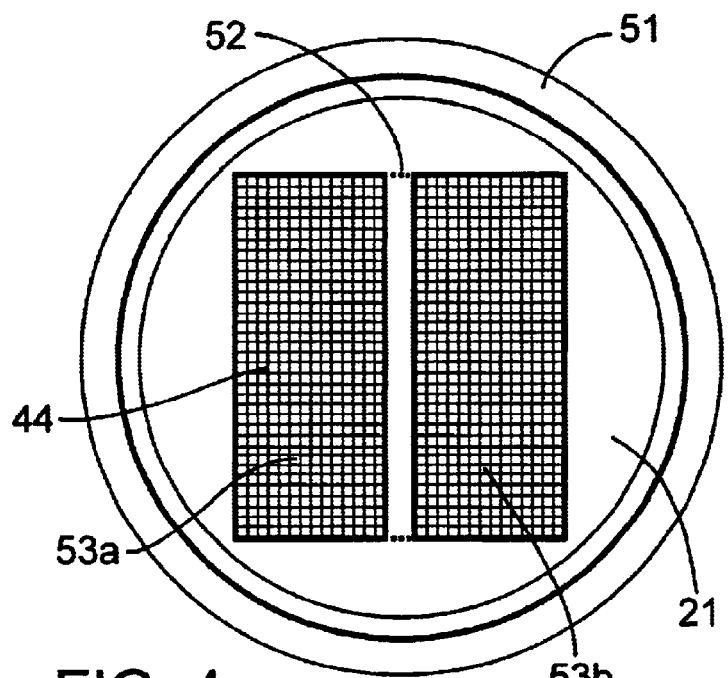
FIG. 4 is a plan view of a reticle, discussed in connection with the first representative embodiment, having two pattern-defining regions.

The reticle 21 can have a single pattern-defining region comprising subfields 44 defining respective portions of the pattern. Alternatively, the reticle 21 can have multiple pattern-defining regions each defining a respective major portion of the pattern and each comprising subfields 44 defining respective portions of the pattern. A representative reticle 21 having multiple pattern-defining regions 53a, 53b is shown in FIG. 4. The reticle 21 is formed, by way of example, from a silicon wafer having a diameter of 200 mm. To provide ease of wafer handling, improved accuracy and precision of wafer-conveying, and reduced wafer bending whenever the reticle is mounted on different reticle stages, the reticle 21 includes a supporting frame 51. Also, to increase the rigidity of the overall reticle structure, the reticle also may include one or more relatively wide major struts 52 extending between and separating the pattern-defining regions 53a, 53b.

Figure 5:
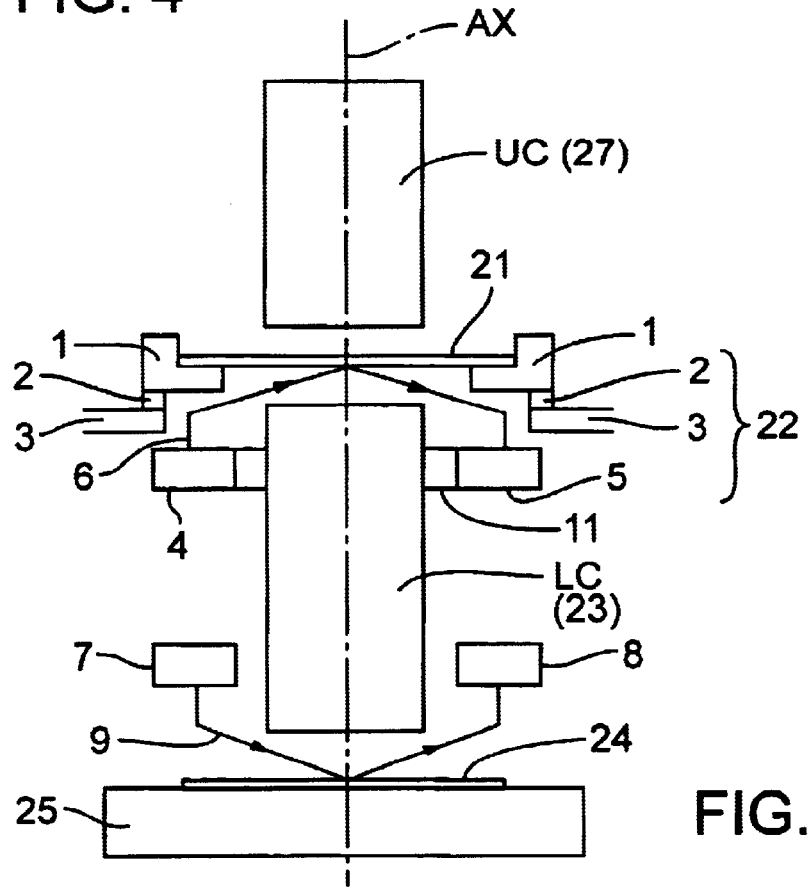
FIG. 5 is an elevational schematic view of a CPB microlithography apparatus, as described in connection with the first representative embodiment, including a reticle-focus-detection device.

Reference now is made to FIG. 5. For exposure, a wafer 24 is placed on the wafer stage 25 and a reticle 21 is placed on the reticle stage 22. A focus-detection beam 9 produced by a light-emitting system 7 is directed to be incident on the wafer 24 at an inclined angle. Light of this beam reflected from the wafer surface is detected by a light-receiving system 8. In response to focus and positional data provided by the detected beam 9, controlled vertical (axial) and tilt movements (relative to the optical axis AX) of the wafer stage 25 are made by actuators (not shown) located in at least three places beneath the stage 25. Hence, the wafer 24 is provided with an "auto-focus" detection scheme.

Wafer auto-focus detection normally is performed photoelectrically. According to this principle, the focus-detection beam 9 is caused to vibrate on a slit situated upstream of the light-receiving system 8. Vibration of the beam is achieved by reflecting the beam 9 from a vibrating mirror (not shown, but vibrating at a frequency of, e.g., several kHz). Hence, a light beam vibrating at twice the vibrational period of the mirror is detected to determine a position of best focus. I.e., as the focus-detection beam is caused, by reflection from a mirror vibrating at a frequency f, to sweep over a slit, the beam sweeps over the slit twice per each back and forth movement of the mirror. One forward movement the mirror (constituting a half swing) produces one output from the light-receiving system, and one backward movement of the mirror produces one output from the light-receiving system. Therefore, the frequency of the output signal is twice the frequency of mirror vibration. This same technique can be exploited with the reticle auto-focus detection scheme.

Figure 6:
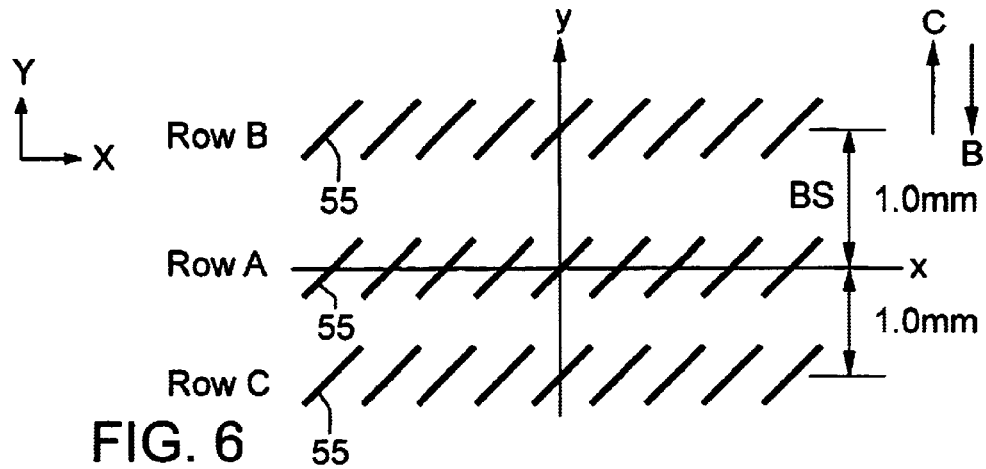
FIG. 6 is a plan view showing an exemplary arrangement of focus-detection beams as usable for detecting wafer "focus" (i.e., axial height position of the wafer).

To accommodate the continuously scanning movement of the wafer stage 25 during exposure, the focus-detection beam 9 is divided into multiple one-dimensional beamlets 55 arranged in a plurality of rows (three rows A, B, C of beamlets shown in FIG. 6). To produce the multiple beamlets, the light-emitting system 7 is provided with a corresponding slit array and a lens system that produce, from a single focus-detection beam 9, multiple parallel beamlets 55 of light of a defined size and having a defined spacing. One row of beamlets 55 (row B in FIG. 6) is used for the feed-forward of data concerning wafer indentation and projection during stage scanning in a first direction. Another row (the middle row, row A in FIG. 6) is used for servo control of reticle axial height correction (as well as of other imaging corrections such as focus, rotation, and magnification). The remaining row (row C in FIG. 6) is used for feed-forward of data concerning wafer indentation and inclination during stage scanning in a second direction opposite the first direction. In "feed-forward," pre-exposure information is obtained on wafer indentation and inclination by comparing, for example, the respective axial heights of two rows before exposing a subfield in the first of the rows. "Indentation" of a wafer pertains to surface topography features or characteristics that result in the wafer surface not being planar. Detection of indentation normally is required before exposing a corresponding region on the wafer, so as to obtain the best resolution. The Y-axis in the figure is the axis to which scanning movement of the wafer stage 25 is parallel. Whenever the wafer stage 25 moves in the Y-direction indicated by the arrow B, the row B of beamlets 55 is used for feed-forward; and whenever the wafer stage 25 moves in the Y-direction indicated by the arrow C, the row C of beamlets 55 is used for feed-forward.

In FIG. 6, the 45-degree tilt of the beamlets is effective for detecting focus of a region of the wafer on which the pattern already has been formed. Usually, a pattern on the wafer 24 includes horizontal lines as well as vertical lines, along with some indentation. If the beamlets 55 were oriented exactly vertically, then focus information obtained from a patterned region of the wafer 24 would not be entirely correct due to effects of indentation. A similar error would arise if all the beamlets 55 were oriented exactly horizontally. Hence, the 45-degree tilt.

The "beam spacing" BS between adjacent rows of beamlets 55 is determined by factors such as the flatness (planarity) of the wafer 24, surface roughness of the wafer, and the inclination of the wafer stage 25 relative to the optical axis AX (FIG. 5). (I.e., respective degrees of indentation and inclination can be obtained from axial-height data obtained using the beamlets 55 of row B and row C. In the present example, the beam spacing BS is set at 1 mm. Residual controllable differences (residual errors left after making corrections using, for example, piezo-electric actuators to adjust wafer position) are controlled by the dynamic focus control of the projection-lens system 23, in addition to the reticle-focus-tracking error described later.

Referring further to FIG. 5, "UC" denotes an upper column containing the illumination-optical system 27 and an electron gun (serving as the source of the illumination beam). "LC" denotes a lower column containing the projection-lens system 23. The reticle 21 is mounted on the reticle stage 22 that includes a stage plate 1 supported relative to a base 3 by vertical actuators 2. The actuators 2 are located actually in three different places between the plate 1 and the base 3 to permit vertical and tilting control of the reticle stage 22. Exemplary actuators 2 are piezo-electric elements. Item 6 is a reticle-focus-detection beam having an inclined angle of incidence to the reticle 21. The reticle-focus-detection beam 6 is produced by a light-emitting system 4, and is detected (after reflecting from the reticle 21) by a height detector 5 that receives the reticle-focus-detection beam.

During operation, the projection-lens system 23 generates heat from passage of electrical energy through various coils of the constituent lenses. Ordinarily, the lower column LC is cooled to avoid performance drift of the projection-lens system 23 from thermal expansion. Accordingly, it is desirable that the light-emitting system 4 and the height detector 5 be attached to the lower column by coupling members 11 made of a low-thermal-expansion material (e.g., "Zerodur").

As will be understood readily by persons skilled in the relevant art, at least the reticle 21, reticle stage 22, lower part of the upper column UC, and upper part of the lower column LC are contained inside a vacuum chamber (not shown). The reticle-focus-detection beam 6 emitted from the light-emitting system 4 is transmitted into the vacuum chamber through a window (not shown) attached to a flange on the vacuum chamber.

The height detector 5 includes a light-receiving surface including a light sensor. The light sensor can be any suitable device that can detect and measure the position of the reticle-focus-detection beam 6 incident thereon. For example, the light sensor can be a CCD comprising a one- or two-dimensional array of light-sensitive pixels, a sensor of which the light-sensitive portion simply is split into multiple portions (each requiring a respective driver), or a PSD (position-sensitive-detector) in which the light-sensitive portion is not split, but position information is obtained nevertheless. Any of these configurations fills the following need: the reticle-focus-detection beam 6 emitted from the light-emitting system 4 is reflected by the reticle 21. If the "height" (axial position) of the reticle 21 relative to the projection-lens system 23 varies, then the beam 6 reflected from the reticle 21 exhibits a lateral deviation from the specified trajectory of the beam 6. This lateral deviation is detected as a corresponding change in the position at which the light 6 is incident on the light-receiving surface of the height detector 5.

The reticle-focus-detection beam 6 desirably is a portion of the light output from an LED or halogen lamp (wavelength within the range of visible to infrared light, i.e., approximately 600 to 900 nm). These exemplary sources are sufficient for providing a quantity of reflected light even for silicon-type reticle materials. Individual focus-detection beamlets are produced by passing the reticle-focus-detection beam 6 from the source simultaneously through multiple slits or other suitable openings. The number of beamlets can vary, depending upon the required accuracy with which detection of the axial height position of the reticle 21 is to be performed, and on the number of subfields in a row. For some applications, the number of beamlets corresponds at least to the number of subfields in a row so that the axial height position of each subfield can be detected without changing the beam-irradiation position. The beamlets are shaped by a lens system (not shown) to have individual beamlet diameters of approximately 0.05 mm immediately before the beamlets strike the reticle. Hence, when the beamlets strike the reticle 21, the resulting illumination spots on the reticle are shaped as ellipses each having a minor axis length of 0.05 mm.

Figure 7A:
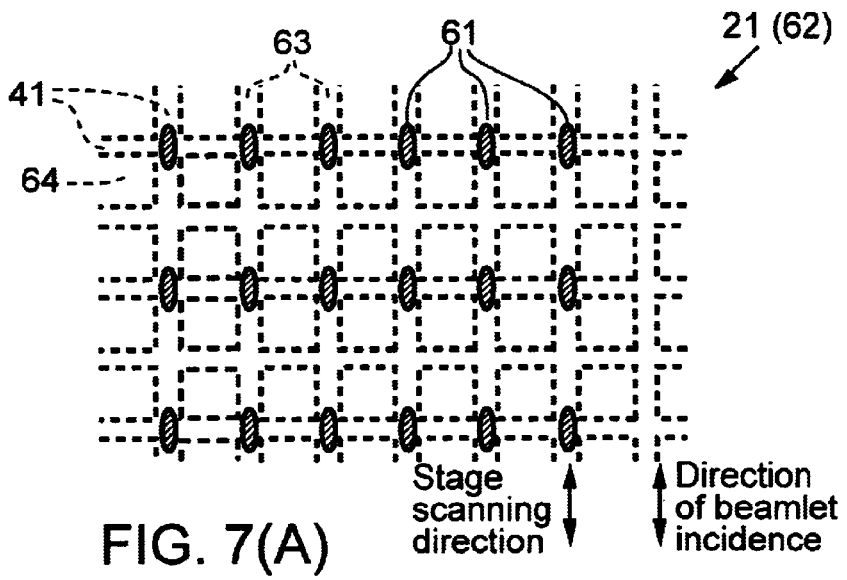
FIGS. 7(A)–7(B) are respective planar views showing, as described in the first representative embodiment, impingement of reticle-focus-detection beamlets on the "membrane side" (non-strut side) of the reticle, within regions from which, on the opposite side of the reticle, the struts extend.
Figure 7B:
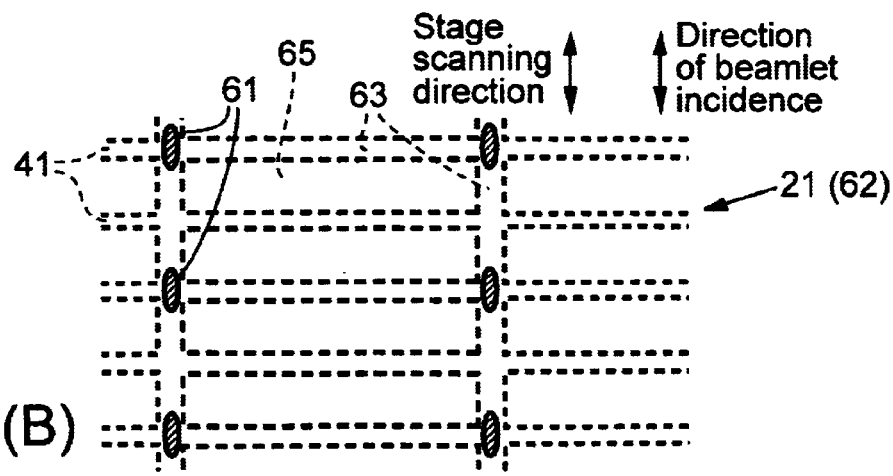

The reticle auto-focus mechanism desirably is usable with any of various types of reticles, including stencil-type reticles and scattering-membrane reticles. With a stencil-type reticle, a narrow beamlet impinging on the reticle at a feature-defining aperture will pass at least partly through the aperture. Consequently, according to this embodiment, the respective loci on the reticle 21 impinged by the beamlets can be located on the membrane side (non-strut side) of the minor struts 41 because these regions include no apertures. Normally, the membrane side is the downstream-facing surface of the reticle 21, as shown in FIG. 5. This is shown in FIGS. 7(A)–7(B). In FIG. 7(A), multiple beamlets 61 are incident on the surface of the reticle 21 on the membrane side 62. The struts 41 extend away from the viewer on the opposite side of the reticle 21. The beamlets 61 are incident within regions 63 from which, on the opposite side of the reticle, the struts 41 extend. The regions 63 do not define any pattern elements. Hence, even with a stencil-type reticle, the beamlets 61 are not incident on any pattern-defining apertures. FIG. 7(A) depicts a reticle 21 comprised of square subfields 64, and FIG. 7(B) depicts a reticle 21 comprised of horizontally elongated subfields 65.

Alternatively, as discussed below, the loci impinged by the beamlets can be on upstream-facing surfaces of the minor struts 41. Such surfaces are also examples of non-pattern-defining surfaces.

To ensure that loci impinged by the beamlets are at minor strut positions regardless of any vertical movement of the reticle 21, it is desirable that the orientation of beamlet incidence be in a direction along which the minor struts extend across the reticle. This is evident in FIGS. 7(A)–7(B).

Second Representative Embodiment

This embodiment is directed to exemplary details of the reticle referred to in the first representative embodiment.

Figure 8:
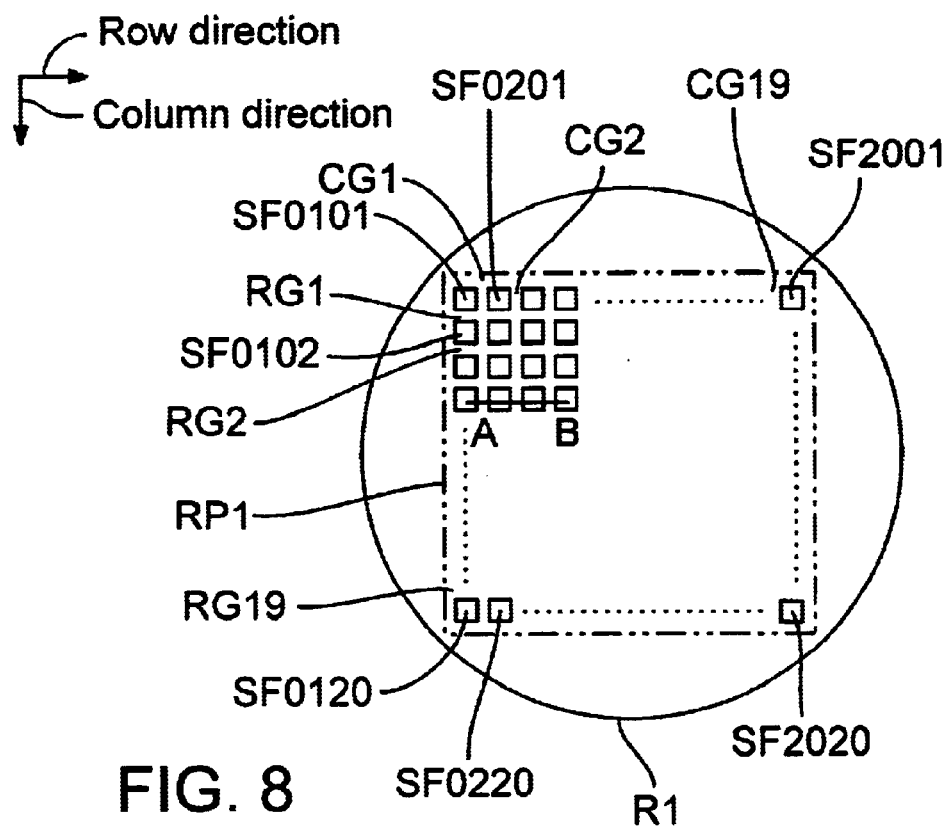
FIG. 8 is a plan view of a reticle, discussed in connection with the second representative embodiment, comprising multiple rows each including multiple subfields.

A reticle R1 according to this embodiment is shown in FIG. 8, providing a plan view from an upstream direction (i.e., from a direction in which the reticle R1 is illuminated by the illumination beam). The reticle R1 includes a pattern region RP1, which is the region defining the pattern to be projected onto the wafer. In this embodiment, the pattern region RP1 has a rectangular profile.

The pattern region RP1 is not limited to a single region on the reticle R1. Alternatively to a single region, the pattern region RP1 can comprise two or more regions (see, e.g., FIG. 4, discussed above).

The pattern region RP1 comprises multiple subfields SF0101–SF2020 (generally referred to collectively as the subfields SF). The subfields SF are disposed positionally in the manner of a rectilinear lattice in the pattern region RP1. Specifically, the subfields SF are lined up in straight lines in the row direction and in the column direction. In FIG. 8, each row extends horizontally and each column extends vertically. The "row direction" is the direction (horizontal in FIG. 8) in which each row extends, and the "column direction" is the direction (vertical in FIG. 8) in which each column extends. In the configuration shown in FIG. 8, 20 subfields SF are disposed in the row direction, and 20 subfields SF are disposed in the column direction. It will be understood that the array of subfields SF is not limited to 20 subfields in the row direction and 20 subfields in the column direction; any number of subfields may be disposed in the row and column directions.

Directions on the reticle R1 are as follows. The direction in which the illumination beam is successively deflected for exposure is a direction perpendicular to the direction in which the reticle stage is scanned. In FIG. 8, the direction in which the illumination beam is successively deflected for exposure is parallel to the row direction (i.e., the horizontal direction in FIG. 8). The direction in which the reticle stage is scanned is parallel to the column direction (i.e., the vertical direction in FIG. 8).

The subfield SF0101 is located at the intersection of the first row and the first column; the subfield SF0201 is located at the intersection of the first row and the second column; and the subfield SF2001 is located at the intersection of the first row and the twentieth column. Similarly, the subfield SF0102 is located at the intersection of the second row and the first column; the subfield SF0120 is located at the intersection of the twentieth row and the first column; and the subfield SF2020 is located at the intersection of the twentieth row and the twentieth column. Generally, the length of each row is equal to the length of the region that can be illuminated by lateral deflection of the illumination beam for purposes of exposure. (In the reticle configuration of FIG. 4, the length of the region that can be illuminated by lateral deflection of the illumination beam for purposes of exposure is the shorter dimension of each region 44.)

It will be understood that the profile of each subfield SF is not limited to a square profile. A subfield SF can have any of various profiles that allow the subfields to be lined up in the manner of a regular array. For example, each subfield can have a regular hexagonal profile.

A row minor strut RG1 is disposed between the row containing the subfields SF0101–SF2001 and the row containing the subfields SF0102–SF2002. Similarly, respective row minor struts RG2 through RG19 are disposed between the other rows of subfields SF. The row minor struts RG1–RG19 (collectively referred to as the row minor struts RG) are spaced equally apart from each other in the column direction. The row minor struts RG constitute a portion of the overall support structure for the reticle R1, and serve in part to separate and define the subfields SF. The shape of each row minor strut RG, as viewed from upstream, is rectangular, extending in the row direction the full length of a row of subfields.

A column minor strut CG1 is disposed between the column containing the subfields SF0101–SF0120 and the column containing the subfields SF0201–SF0220 that are lined up in the column direction. Similarly, respective column minor struts CG2 through CG19 are disposed between the respective subfields SF that are lined up in the column direction. The column minor struts CG1–CG19 (collectively referred to as the column minor struts CG) are spaced equally apart from each other in the row direction. The column minor struts CG constitute a portion of the overall support structure for the reticle R1, and serve in part to separate and define the subfields SF. The shape of each column minor strut CG, as viewed from an upstream direction, is rectangular, extending in the column direction the full length of a column of subfields.

Figure 9:
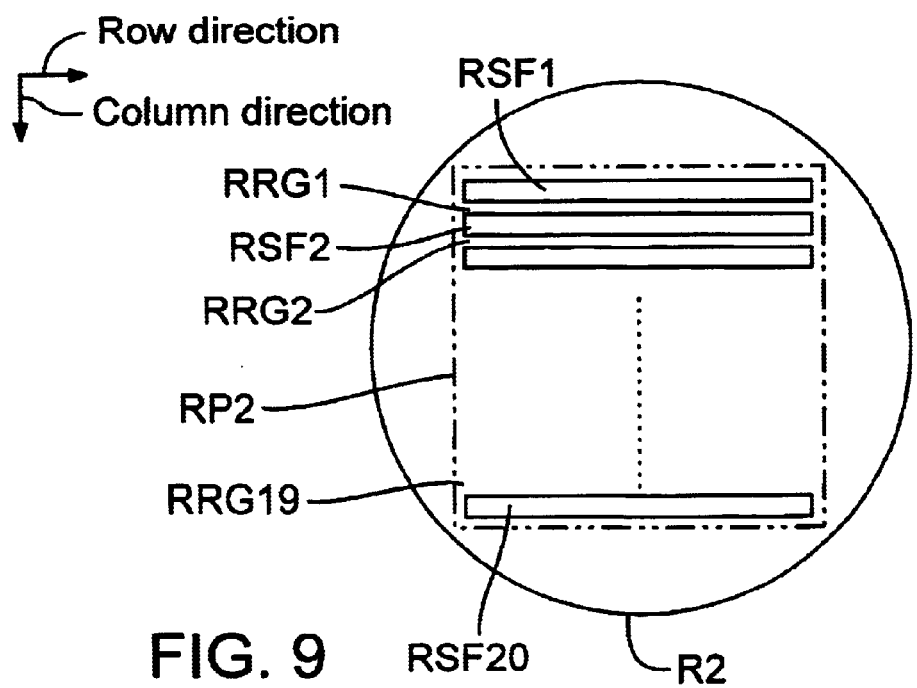
FIG. 9 is a plan view of a reticle, discussed in connection with the second representative embodiment, comprising a column of multiple one-dimensional subfields.

Alternatively, a reticle can be configured as the reticle R2 shown in FIG. 9, providing a plan view as seen from upstream. The reticle R2 comprises a pattern region RP2 defining the pattern. Multiple one-dimensional subfields RSF1–RSF20 (collectively referred to herein as "one-dimensional subfields" RSF) are disposed in the pattern region RP2. The one-dimensional subfields RSF define respective portions of the pattern. Each one-dimensional subfield RSF, as viewed from upstream, has a rectangular profile extending in the row direction. The one-dimensional subfields RSF are disposed side-by-side, with their longitudinal dimensions (long sides) parallel to each other. One-dimensional minor struts RRG1–RRG19 (collectively referred to as "one-dimensional minor struts" RRG) are disposed between the respective one-dimensional subfields RSF. The one-dimensional minor struts RRG provide mechanical support for the one-dimensional subfields RSF. Each one-dimensional minor strut RRG, as viewed from upstream, has a rectangular profile extending in the row direction.

Figure 10:
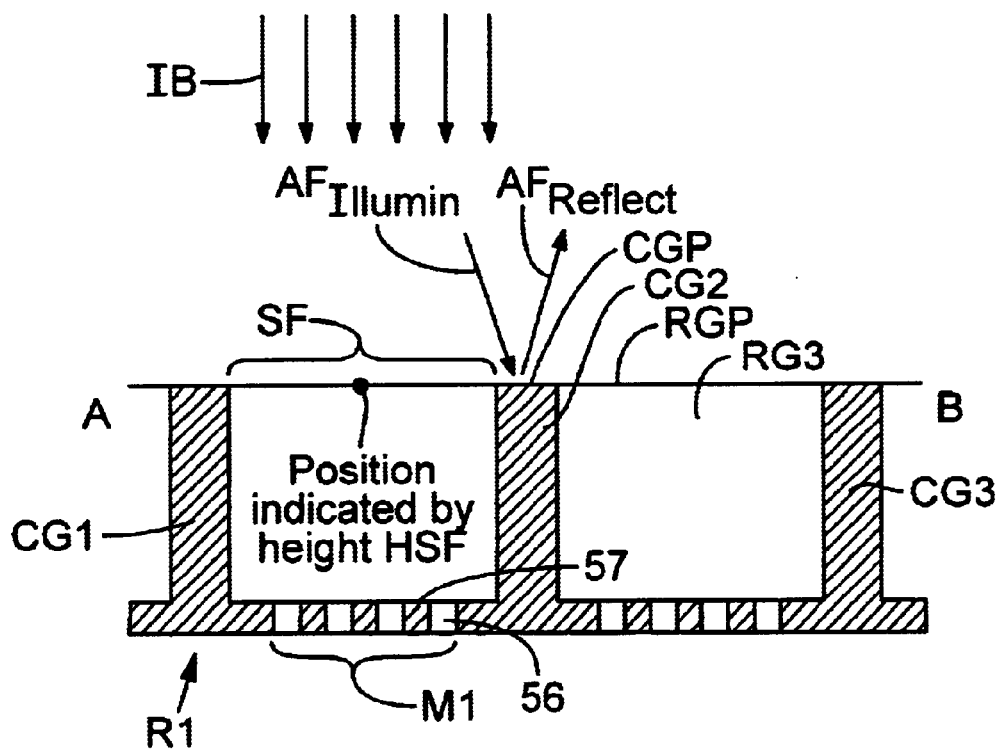
FIG. 10 is an elevational section of a portion of a stencil reticle, configured generally as shown in FIG. 8, showing two subfields.

Continuing with the description of the reticle R1 of FIG. 8, an elevational section (along the line A-B in FIG. 8 ) is shown in FIG. 10. In the reticle R1 of FIG. 10, each subfield SF appears as a deep recess in the framework represented by the minor struts RG, CG. At the bottom of each recess is a respective membrane region M1 that defines the respective portion of the pattern defined by the reticle R1. As an illumination beam IB (propagating from upstream) impinges on a selected subfield SF, the illumination beam IB illuminates the respective membrane region M1. In the reticle of FIG. 10, the respective pattern portion defined by a given subfield SF is configured as a corresponding arrangement of through-holes (openings) 56 in the respective membrane region M1. The through-holes 56 are transmissive to charged particles of the illumination beam IB, which experience little to no scattering as they pass through the through-holes 56. The membrane portions 57 of the membrane region M1, on the other hand, transmit particles of the illumination beam IB with substantial scattering at a wide scattering angle. This type of reticle is termed a "scattering-stencil" or simply a "stencil" reticle.

Figure 11:
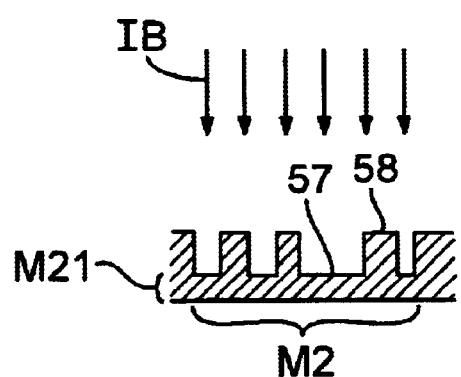
FIG. 11 is an elevational section of a single subfield of a scattering-membrane reticle, configured generally as shown in FIG. 8.

Alternatively, the reticle R1 can be configured with membrane regions M2 as shown in FIG. 11, which depicts an elevational section of the membrane region M2 of a single subfield SF. The illumination beam IB is incident from upstream on the membrane region M2. The membrane region M2 comprises a film M21 including thin regions 57 that transmit charged particles of the illumination beam IB with little to no scattering, and thick regions 58 that transmit charged particles of the illumination beam IB with substantial scattering at a wide angle. This type of reticle is termed a "scattering-membrane" or simply a "membrane" reticle.

Referring further to FIG. 10, the upstream-facing surfaces of the row minor struts RG (these surfaces are referred to as the "row-minor-strut surfaces" RGP) and the surfaces of the column minor struts CG (these surfaces are referred to as the "column-minor-strut surfaces" CGP) are reflective to incident laser light. The row-minor-strut surfaces RGP and column-minor-strut surfaces CGP are referred to collectively as the "minor strut surfaces" GP.

Third Representative Embodiment

Reviewing certain details set forth in the first representative embodiment, in FIG. 5, the wafer 24 is carried on the wafer stage 25. The wafer-focus-detection beam 9 is incident, at an inclined angle, on the wafer 24 from the light-emitting system 7; light reflected from the wafer 24 is detected by the light-receiving system 8. Vertical and tilt control of the wafer stage 25 is achieved by means of actuators (not shown) situated in three locations in a tripod manner below the wafer stage 25. This auto-focus device for the wafer 24 operates according to a photoelectric-detection principle set forth in, for example, Japan Kôkai Patent Document No. 56-42205 by the present applicant. According to this principle, the wafer-focus-detection beam 9 is caused to vibrate on a slit just upstream of the light-receiving system 8. The vibration is achieved by means of a vibrating mirror (vibrating at a frequency of, e.g., several kHz). The best focus position of the wafer 9 is determined by detecting a wave having a frequency that is double the vibrational frequency of the mirror. To accommodate the scanning movement of the wafer stage 25 during exposure, multiple rows (three shown in FIG. 6) of one-dimensional multi-point beamlets 55 are used, e.g., as disclosed in Japan Kôkai Patent Document Nos. 6-283403 and 8-064506 by the present applicant. One row (row B) of beamlets 55 is used for feed-forward of data during scanning of the wafer stage 25 in one direction parallel to the Y-axis, the middle row (row A) is used for servo control, and the remaining row (row C) is used for feed-forward of data during scanning of the wafer stage 25 in the reverse direction parallel to the Y-axis. In FIG. 6, the Y-direction (vertical direction) represents the axis along which the wafer stage 25 moves. Whenever the wafer stage 25 moves in the Y-axis direction denoted by the arrow B, the row B is used for feed-forward; whenever the wafer stage 25 moves in the Y-axis direction denoted by the arrow C, the row C is used for feed-forward.

The spacing BS of these beamlets 55 from each other is a function of the planarity of the wafer 24 and the inclination of the wafer stage 25.

Figure 13:
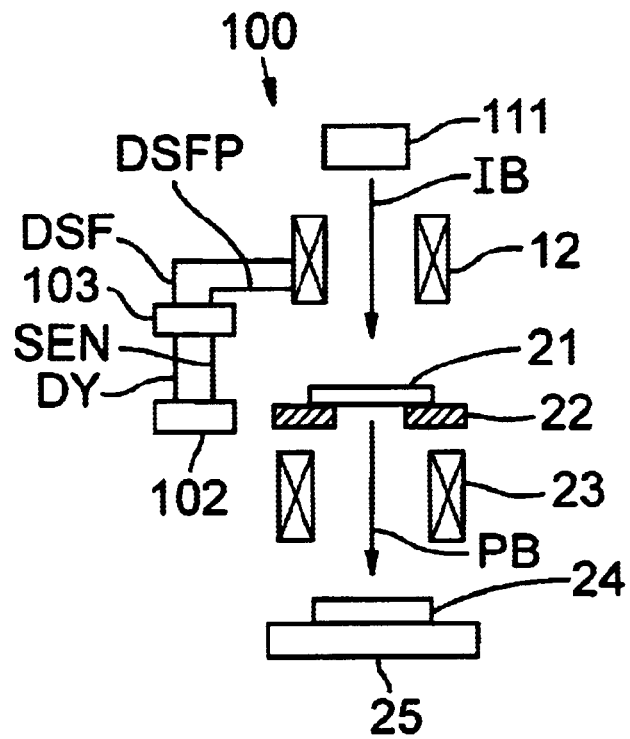
FIG. 13 is an elevational schematic diagram of a device, as described in the third representative embodiment, for controlling movement and position of the reticle stage, movement and position of the wafer stage, and auto-focus operation in a CPB microlithography apparatus.

Turning now to FIG. 13, certain details of a device, according to this embodiment, for controlling the reticle stage 22, the wafer stage 25, and the auto-focus operation of a CPB microlithography apparatus 100 are illustrated. The apparatus 100 is similar to the apparatus shown in FIG. 5, but is depicted in block form in FIG. 13. A source 111 (e.g., electron gun) produces the illumination beam IB that passes through the illumination system 12 to the reticle 21 situated on the reticle stage 22. The patterned beam PB resulting from transmission of charged particles of the illumination beam IB passing through the reticle 21 pass through a projection-lens system 23 to the wafer 24 situated on the wafer stage 25. The apparatus 100 includes a reticle-stage-detection device 102 and a reticle-focus-detection mechanism 103.

Figure 14:
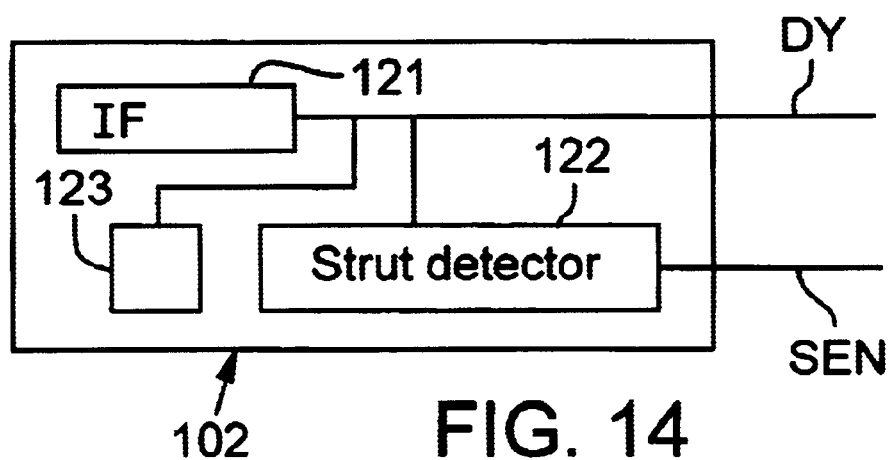
FIG. 14 is a block diagram of certain details of the reticle-stage-detection device shown in FIG. 13.

The reticle-stage-detection device 102 is configured to detect the position of the reticle stage 22, and is described with reference to FIG. 14. The reticle-stage-detection device 102 comprises at least one interferometer (IF) 121 and a strut detector 122. The interferometer 121 desirably is a laser interferometer that detects the position of the reticle stage 22 (e.g., in the Y-direction) and outputs interferometer data DY corresponding to the position of the reticle stage 22. Desirably, another interferometer (not shown, but similar to the interferometer 121) is included that detects the position of the reticle stage 22 in the X-direction. The strut detector 122 detects the reticle stage 22 whenever the stage is in a detection-enable position PEN. The reticle stage 22 is located at the detection-enable position PEN whenever an AF-detection light 132 (described later below) is incident on surfaces RGP of row struts. The reticle-stage-detection device 102 also desirably includes a memory 123 that stores previously obtained interferometer data DY corresponding to the detection-enable position PEN. The strut detector 122 outputs an AF-enable signal SEN whenever the interferometer data DY stored in the memory 123 match the interferometer data DY currently being output by the interferometer 121. The AF-enable signal SEN indicates that the reticle stage 22 is in the detection-enable position PEN.

As an alternative to the configuration described above, the strut detector 122 can be located in the reticle-focus-detection mechanism 103. The reticle-focus-detection mechanism 103 is configured to detect "heights" HSF of the respective subfields SF of the reticle 21. (As is shown in FIG. 10, the "heights" HSF are located substantially at the same elevation as the upstream-facing row strut surfaces RGP, and are respective positions corresponding to the centers of gravity of the respective subfields SF viewed from an upstream direction.) The reticle-focus-detection mechanism 103 outputs height data DSF corresponding to actual heights HSF, and predicts the heights HSF of subfields SF located adjacent to the subfield SF of which the height HSF is being detected. The height data DSF usually represents an average of multiple readings. The reticle-focus-detection mechanism 103 also outputs the predicted height-prediction data DSFP.

Figure 15:
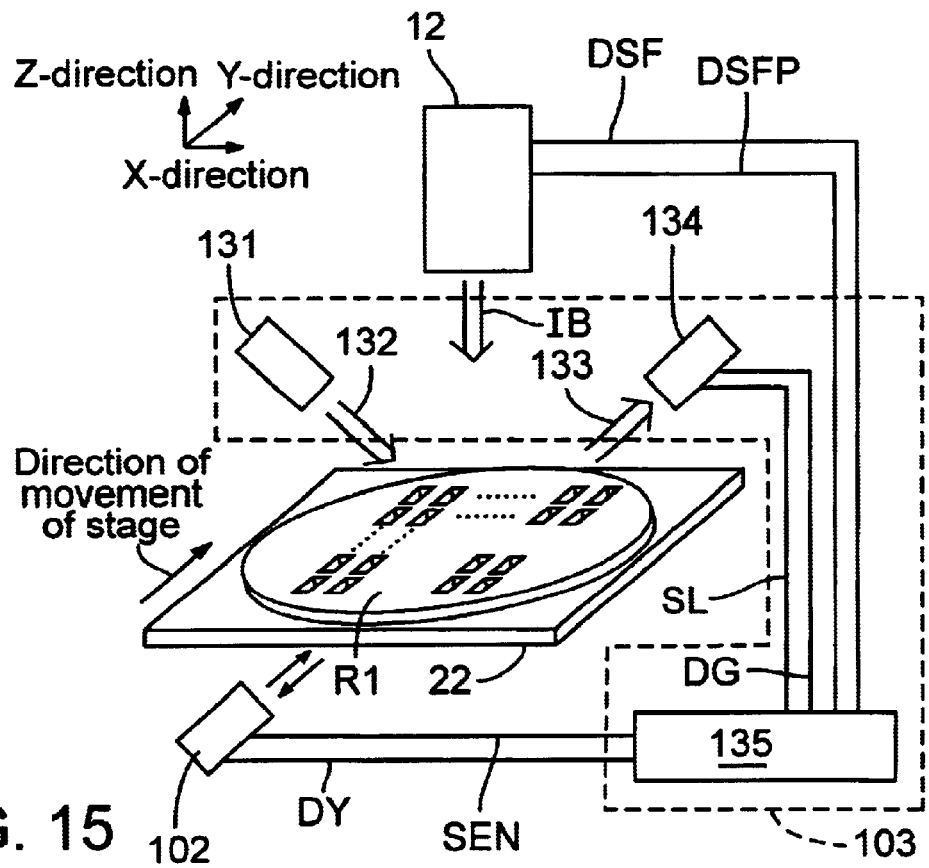
FIG. 15 is a schematic oblique view showing certain details of the illumination system, reticle stage, and reticle-focus-detection mechanism shown in FIG. 13.

Details of the illumination system 12, reticle stage 22, and reticle-focus-detection mechanism 103 now are described with reference to FIG. 15, wherein the Y-direction is the direction of stage movement. The X-direction is perpendicular to the Y-direction. The Z-direction is perpendicular to the X-Y plane, and extends from the reticle R1 toward the illumination system 12. In the embodiment of FIG. 15, the AF-detection light 132 is incident on the strut-surface side (upstream-facing side) of the reticle R1; in the embodiment of FIG. 5, in contrast, the AF-detection light 6 is incident on the membrane side (downstream-facing side) of the reticle 21 (i.e., the side on which the pattern is defined). Otherwise, there are no essential differences in the manner of focus detection in the embodiment of FIG. 15 versus the embodiment of FIG. 5.

The reticle stage 22 holds the reticle R1 such that the row direction of the subfields SF on the reticle R1 is parallel to the X-direction and the column direction is parallel to the Y-direction. The "height" of the reticle R1 is in the Z-direction.

The illumination system 12 illuminates rows of subfields SF by scanning the illumination beam in the row direction. Meanwhile, the illumination system 12 receives height data DSF from a processor 135. According to this height data DSF, the illumination system 12 imparts corrections to the illumination beam IB as required to reduce various types of distortion and aberration, especially at the positions of the respective subfields SF indicated by the height data DSF.

The reticle-focus-detection mechanism 103 first detects the respective heights of the minor strut surfaces GP of the reticle R1. To such end, the reticle-focus-detection mechanism 103 includes an AF-illumination device 131 (similar to the light-emitting system 4 of the focus-detection beam 6 in FIG. 5), a height detector 134, and the processor 135. The AF-illumination device 131 emits an AF-detection light 132 (similar to the reticle-focus-detection beam 6 in FIG. 5) toward the row minor strut surfaces RGP. Emission of the AF-detection light 132 is constant as the reticle stage 22 is moving in the positive and negative Y-directions. The relative orientation of the AF-detection light 132 is fixed relative to the illumination system 12. Accordingly, whenever the reticle stage 22 moves in the positive Y-direction, the location on the row minor strut surfaces RGP on which the AF-detection light 132 is incident "moves" in the negative Y-direction.

Figure 16:
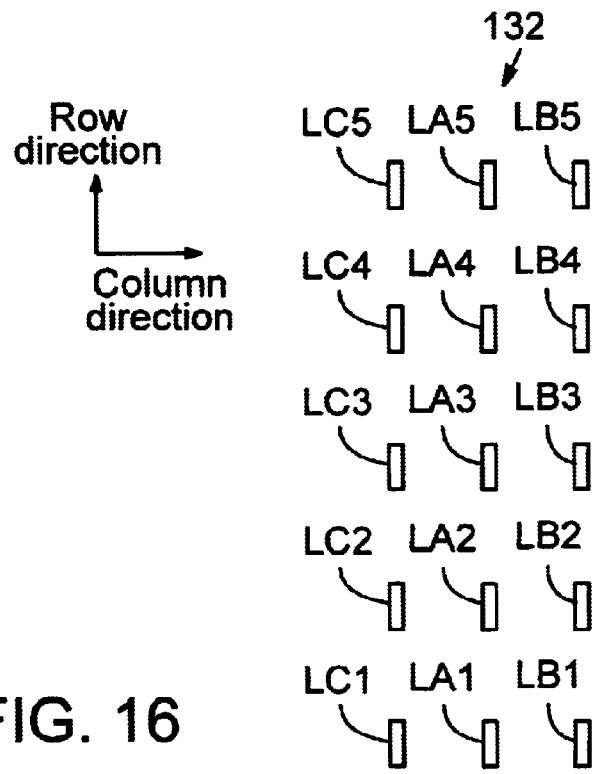
FIG. 16 is a transverse section of three rows of beamlets of AF-detection light as viewed toward the surfaces of the minor struts on which the beamlets impinge, as discussed in connection with the third representative embodiment.
Figure 17:
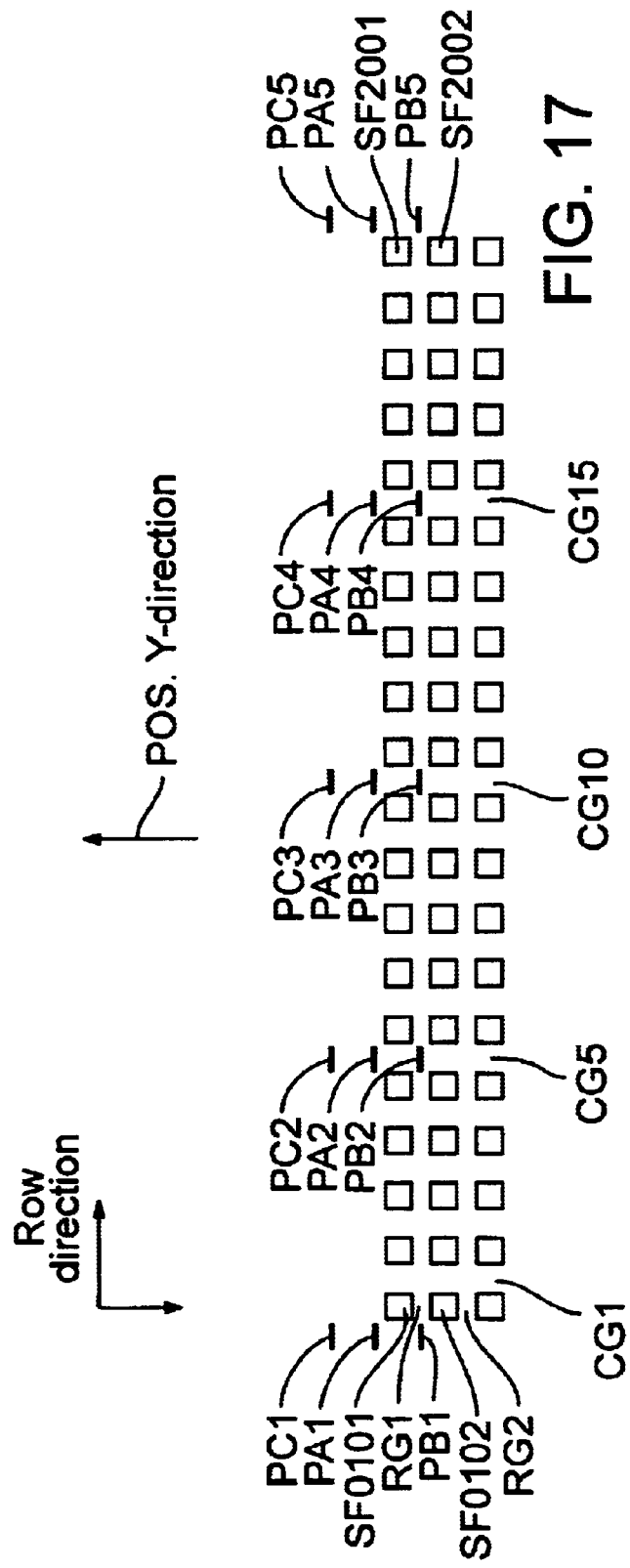
FIG. 17 is a plan view of three rows of subfields on the reticle discussed in the third representative embodiment, showing height-detection loci (located on upstream-facing surfaces of the minor struts) on which the beamlets of AF-detection light, arranged as shown in FIG. 16, can impinge.

The AF-detection light 132 and the location on the minor strut surfaces GP to which the AF-detection light 132 is incident are described further with reference to FIGS. 16 and 17. As discussed above, the AF-detection light 132 is divided into multiple beamlets. FIG. 16 is a transverse section (perpendicular to the propagation direction) showing the beamlets of AF-detection light 132 as viewed from the AF-illumination device 131 toward the minor strut surfaces GP. In FIG. 16, the AF-detection light 132 is an aggregate of multiple beamlets LA1–LA5, LB1–LB5, LC1–LC5. Each beamlet consists of light having a wavelength of 600 to 900 nm, desirably as emitted by a laser, LED, or halogen light source. The beamlets LA1–LA5, LB1–LB5, LC1–LC5 are lined up in three rows extending in the row direction and five columns extending in the column direction of the reticle R1.

Of the beamlets, three rows A, B, C are shown, wherein each row contains respective five beamlets. Row C is the first depicted row and includes the beamlets LC1–LC5, group A is the second depicted row and includes the beamlets LA1–LA5, and row B is the third depicted row and includes the beamlets LB1–LB5. The beamlets also are grouped into five columns. The beamlets in the first depicted column all include the "1" denotation, the beamlets in the second depicted column all include the "2" denotation, and so on.

The respective locations on the minor strut surfaces GP on which the beamlets of AF-detection light 132 are incident (these respective locations are called the "height-detection loci" PA1–PA5, PB1–PB5, PC1–PC5) are described with reference to FIG. 17, depicting a region of the reticle R1 as viewed from upstream. The height-detection locus PA1 is where the beamlet LA1 is incident, the location PB1 is where the beamlet LB1 is incident, the location PC1 is where the beamlet LC1 is incident, and so on. The respective height-detection loci PA1–PA5, PB1–PB5, PC1–PC5 are all located in the vicinity of a corner of a respective subfield SF.

In FIG. 17, the height-detection loci PA1, PB1, PC1 are located near the left end of the row minor strut RG1 (to the left of the subfields SF0101, SF0102) and are lined up in the column direction. The spacing between the height-detection loci PA1 and PB1 desirably is the same dimension as the pitch of the subfields SF in the column direction, which desirably is equal to the spacing between the height-detection loci PA1 and PC1. Hence, the spacing between each of the loci PA1, PB1, PC1 desirably is equal to the pitch of the row minor struts. Similarly, the height-detection loci PA5, PB5, PC5 are located near the right end of the row minor strut RG1 (to the right of the subfields SF2001, SF2002) and are lined up in the column direction. The spacing between the height-detection loci PA5 and PB5 desirably is the same dimension as the pitch of the subfields SF in the column direction, which desirably is equal to the spacing between the height-detection loci PA5 and PC5. Hence, the spacing between each of the loci PA5, PB5, PC5 desirably is equal to the pitch of the row minor struts. The height-detection loci PA3, PB3, PC3 are situated near the center of the row minor strut RG1 (in the row direction), and are lined up in the column direction on the column minor strut CG10. The spacing between the height-detection loci PA3 and PB3 desirably is the same dimension as the pitch of the subfields SF in the column direction, which desirably is equal to the spacing between the height-detection loci PA3 and PC3. Hence, the spacing between each of the loci PA3, PB3, PC3 desirably is equal to the pitch of the row minor struts. The height-detection loci PA2, PB2, PC2 are situated on the column minor strut CG5, midway between the respective loci PA1, PB1, PC1 (as arrayed in the column direction) and the respective loci PA3, PB3, PC3 (as arrayed in the column direction). The respective spacings between the loci PA2 and PB2, and between the loci PA2 and PC2, desirably are as described above. Finally, the height-detection loci PA4, PB4, PC4 desirably are situated on the column minor strut CG15, midway between the loci PA3, PB3, PC3 (as arrayed in the column direction) and the loci PA5, PB5, PC5 (as arrayed in the column direction). The respective spacings between the loci PA4 and PB4, and between PA4 and PC4, are as described above.

Accordingly, the height-detection loci PA1–PC1, PA2–PC2, PA3–PC3, PA4–PC4, and PA5–PC5 are arrayed essentially symmetrically and at essentially equal intervals in the row direction. Furthermore, in the configuration shown in FIG. 17, the respective spacings between the height-detection loci PA1–PC1 and PA2–PC2, for example, are 5 times the pitch of the subfields in the row direction. In other words, this spacing is 5 times the pitch of the minor struts extending in the column direction.

Furthermore, the height-detection loci PA1–PC1 are lined up at equal intervals from each other in the column direction, as are the loci PA2–PC2, PA3–PC3, PA4–PC4, and PA5–PC5. The height-detection loci PA1–PA5 are situated near respective subfields SF that are illuminated by the illumination system 12. The height-detection loci PB1–PB5 are situated near respective subfields SF that are adjacent, in one direction in the column direction, to the subfields SF illuminated by the illumination system 12. Similarly, the height-detection loci PC1–PC5 are situated near respective subfields SF that are adjacent, in the opposite direction in the column direction, to the subfields SF illuminated by the illumination system 12.

Since the orientation of the AF-detection light 132 is fixed with respect to the illumination system 12 as described above, the height-detection loci PA1–PA5, PB1–PB5, PC1–PC5 move over the reticle R1 in the column direction as the reticle R1 moves in the positive Y-direction. Whenever the reticle R1 moves in the negative Y-direction, the height-detection loci PA1–PA5, PB1–PB5, PC1–PC5 move over the reticle R1 in the opposite direction in the column direction.

Figure 18:
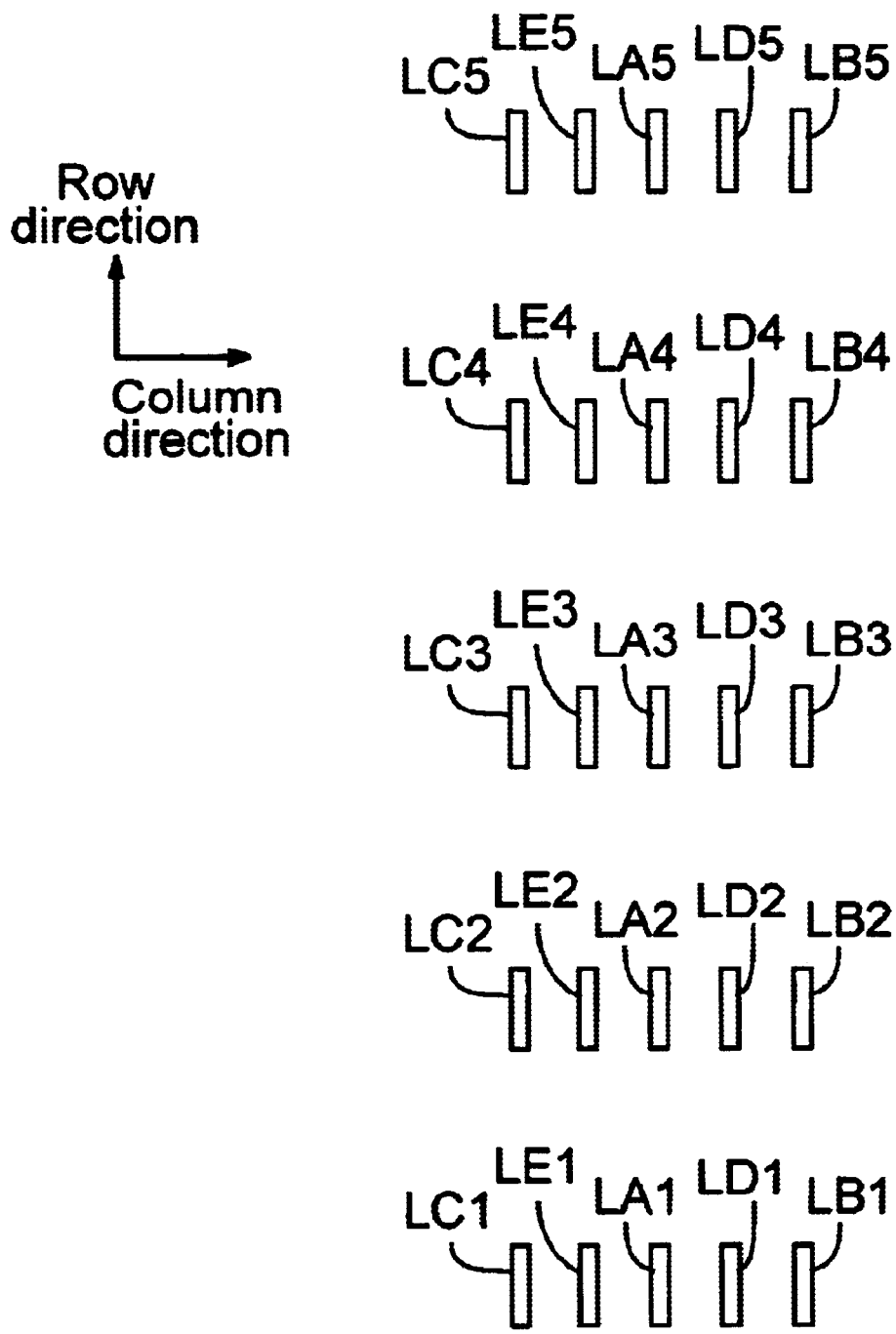
FIG. 18 is a transverse section of five rows of beamlets of AF-detection light as viewed toward the surfaces of the minor struts on which the beamlets impinge, as discussed in connection with the third representative embodiment.

An alternative configuration is shown in FIG. 18, in which the AF-detection light 132 further includes beamlets LD1–LD5 and LE1–LE5 arrayed in the row direction. (FIG. 18 is a transverse section of the AF-detection light 132, perpendicular to the propagation direction, as viewed from the AF-illumination device 131 toward the minor strut surfaces GP.)

Figure 19:
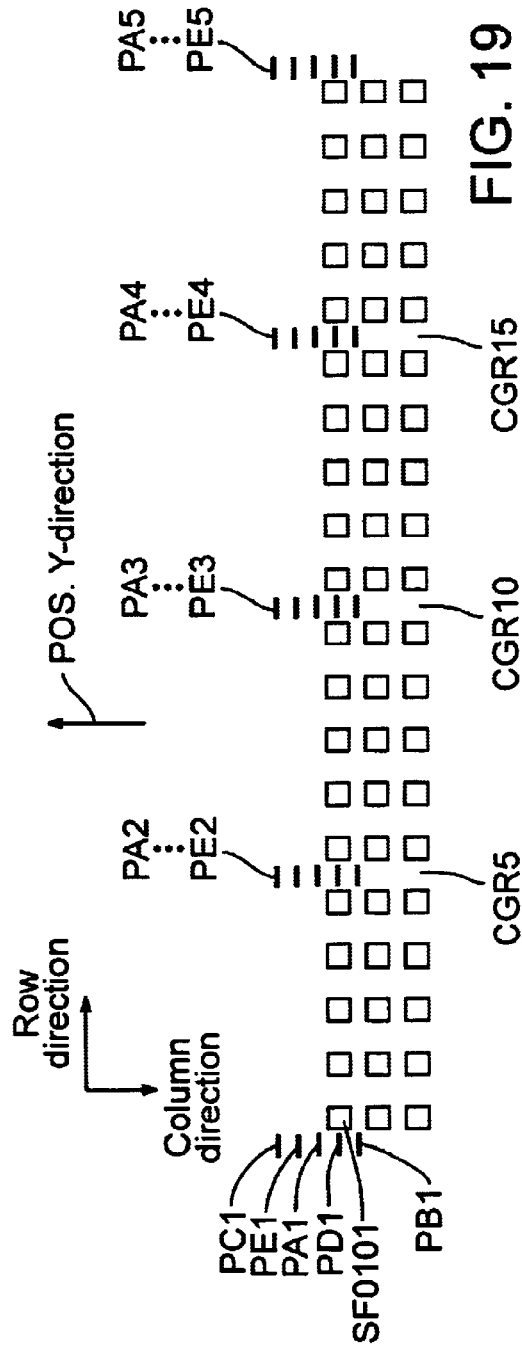
FIG. 19 is similar to FIG. 17, but shows the height-detection loci on which the beamlets of AF-detection light, arranged as shown in FIG. 18, can impinge.

The respective loci on the minor strut surfaces GP at which the beamlets of AF-detection light 132 (shown in FIG. 18) are incident are illustrated in FIG. 19, which is a plan view of the reticle R1 as viewed from upstream. The locus PD1 is where the beamlet LD1 is incident, and the locus PE1 is where the beamlet LE1 is incident. Similarly, the loci PD2–PD5 are where the beamlets LD2–LD5, respectively, are incident, and the loci PE2–PE5 are where the beamlets LE2–LE5, respectively, are incident. The locus PD1 is situated midway between the loci PA1 and PB1. Similarly, the loci PD2–PD5 are situated midway between respective pairs of loci PA2 and PB2, PA3 and PB3, PA4 and PB4, and PA5 and PB5. The locus PE1 is situated midway between the loci PA1 and PC1. Similarly, the loci PE2–PE5 are situated midway between respective pairs of loci PA2 and PC2, PA3 and PC3, PA4 and PC4, and PA5 and PC5. Accordingly, the pitch at which the beamlets LA1–LE1 are lined up in the column direction is approximately one-half the pitch of the subfields SF in the column direction and one-half the pitch of the minor struts extending in the row direction. Also, the beamlets LA1–LE1 are arranged with left-to-right symmetry in the column direction, and the number of beamlets LA1–LE1 is an odd number.

Figure 20:
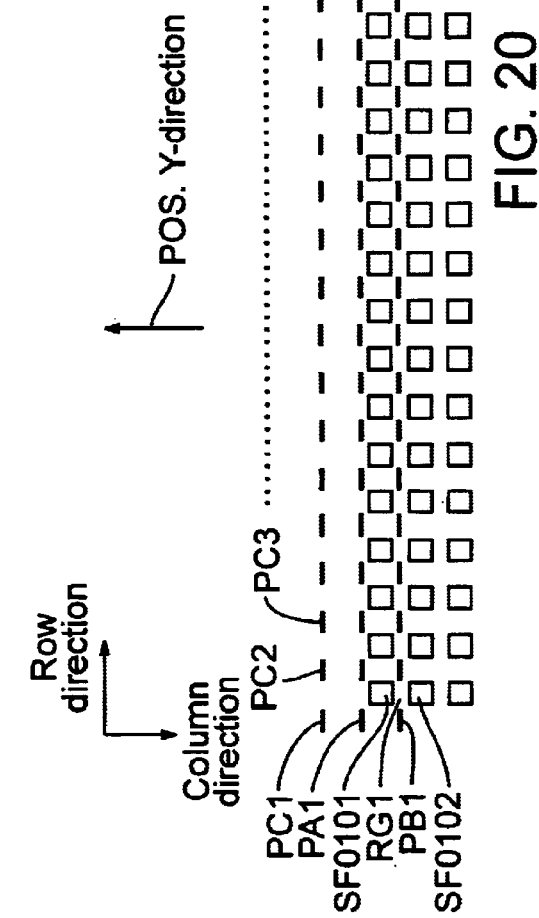
FIG. 20 is a plan view of three rows of subfields on the reticle discussed in the third representative embodiment, showing possible height-detection loci, in the row direction, at which beamlets of AF-detection light can impinge, as discussed in connection with the third representative embodiment.

As shown in FIG. 20, the beamlets of AF-detection light 132 may reach any of the height-detection loci PA1–PA20, PB1–PB20, and PC1–PC20. (FIG. 20 is a plan view of the reticle R1 as viewed from upstream.) The number of loci in any row is equal to the number of subfields in the row direction. Specifically, in FIG. 20, the locus PA1 is in the vicinity of the subfield SF0101, and the loci PA2–PA20 are in the vicinities of the respective subfields SF0201–SF2001. Each of the loci PB1–PB20 is separated from the respective locus PA1–PA20 in the negative column direction by a distance equal to the pitch of the subfields SF in the column direction. Similarly, each of the loci PC1–PC20 is separated from the respective locus PA1–PA20 in the positive column direction by a distance equal to the pitch of the subfields in the column direction.

FIG. 21 is similar to FIG. 17, except that, in FIG. 21, the height-detection loci are oriented at right angles to the orientation of height-detection loci in FIG. 17. As shown in FIG. 21, at a given instant in time the height-detection loci PA2–PC2 may be situated on the column minor strut CG5, the loci PA3–PC3 may be situated on the column minor strut CG10, and the loci PA4–PC4 may be situated on the column minor strut CG15. (FIG. 21 is a plan view of the reticle R1 as viewed from upstream.) In FIG. 21, the position of the locus PA2 is in the vicinity of the subfield SF0501. Similarly, the respective positions of the loci PA3 and PA4 are in the respective vicinities of the subfields SF1001 and SF1501. Each of the loci PB2, PB3, PB4 is separated from the respective locus PA2, PA3, PA4 in the negative column direction by a distance equal to the pitch of the subfields SF in the column direction. Each of the loci PC2, PC3, PC4 is separated from the respective locus PA2, PA3, PA4 in the positive column direction by a distance equal to the pitch of the subfields SF in the column direction.

Fourth Representative Embodiment

Figure 12A:
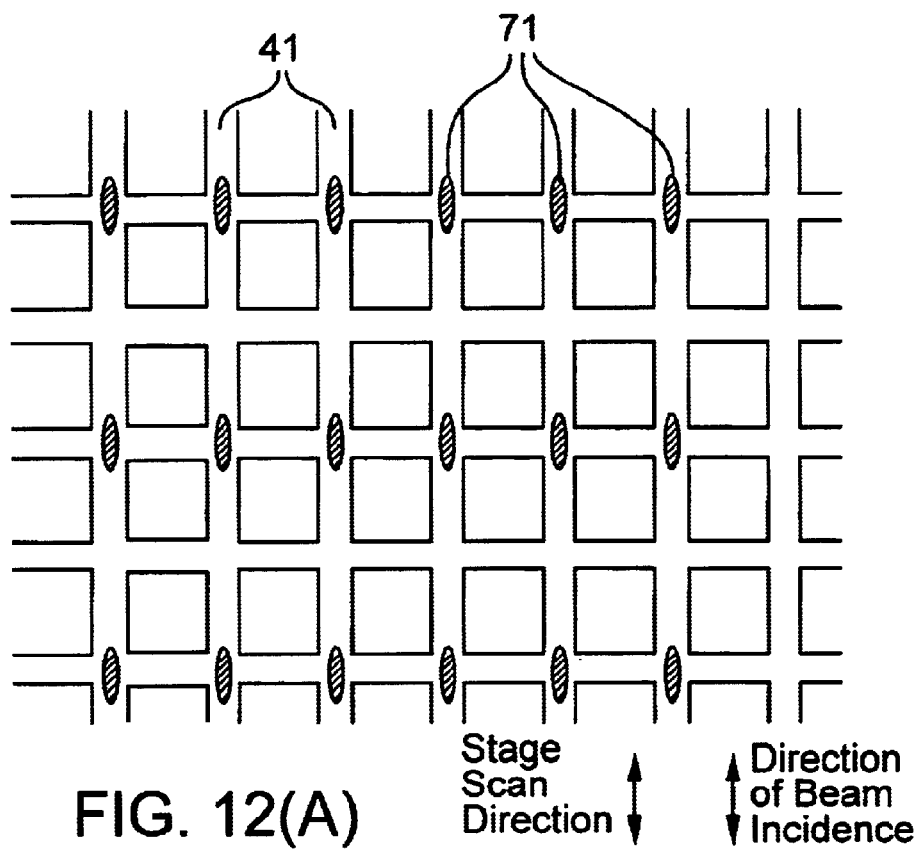
FIGS. 12(A)–12(B) are respective planar views showing, as described in the fourth representative embodiment, impingement of reticle-focus-detection beamlets on the upstream-facing surfaces of minor struts.

The foregoing discussion mainly referred to an exposure scheme in which a reticle pattern is lithographically transferred subfield-by-subfield. A representative reticle used for such exposure is shown in FIG. 12(A), in which the illumination beam is deflected during exposure left-to-right (in the figure) within a controlled range, as described above. (This left-to-right direction is the row direction.) In such a scheme, the illumination beam is blanked between each subfield of the row. The reticle-focus-detection beamlets 71, indicated by shaded ellipses, are arranged in three rows as incident on the reticle. In the direction of stage scanning (column direction), each row of beamlets extends along a respective minor strut 41. The illuminated minor struts 41 are separated by a respective non-illuminated minor strut. Note that the direction of beamlet incidence also is in the stage-scan direction (downward or upward in the figure). This allows the beamlets (reflected from the reticle) to be detected regardless of whether the reticle has experienced any vertical movement.

Figure 12B:
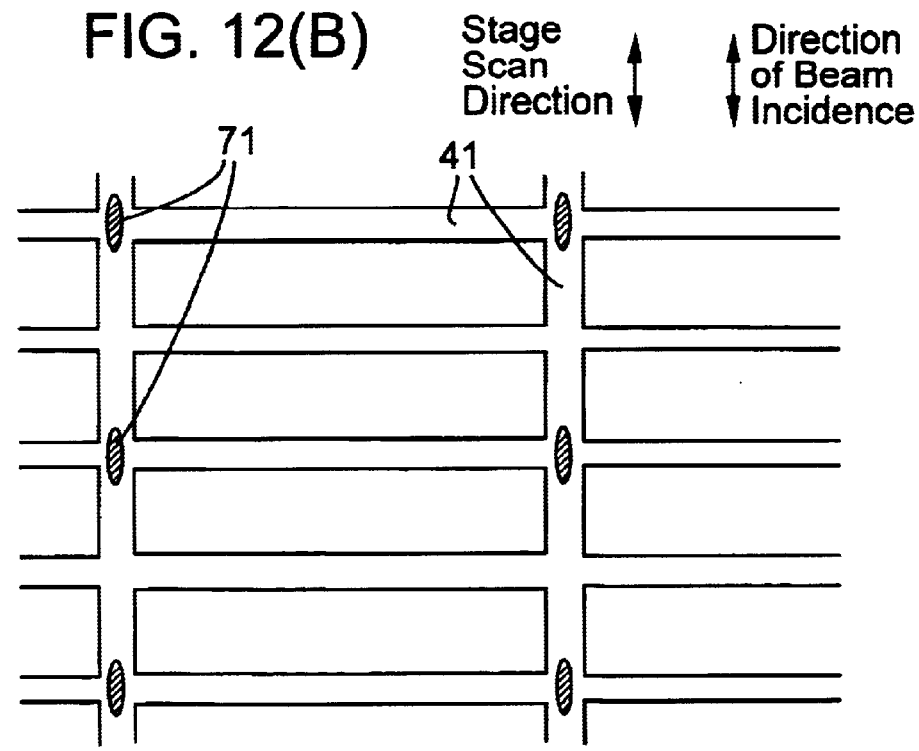

Alternatively, the reticle pattern may be transferred while scanning the beam in a direction perpendicular to the stage-scanning direction (i.e., scanning the beam in the row direction) without blanking the beam during exposure of a row. FIG. 12(B) illustrates a representative reticle used in such an instance, and also shows a representative manner in which rows of focus-detection beamlets are incident on such a reticle. In this scheme, however, since the number of minor struts 41 extending in the vertical direction in the figure (stage-scanning or column direction) is small, a smaller number of beamlets 71 can be directed onto the reticle than on the reticle shown in FIG. 12(A). This could result in less accuracy of height measurements.

Figure 22A:
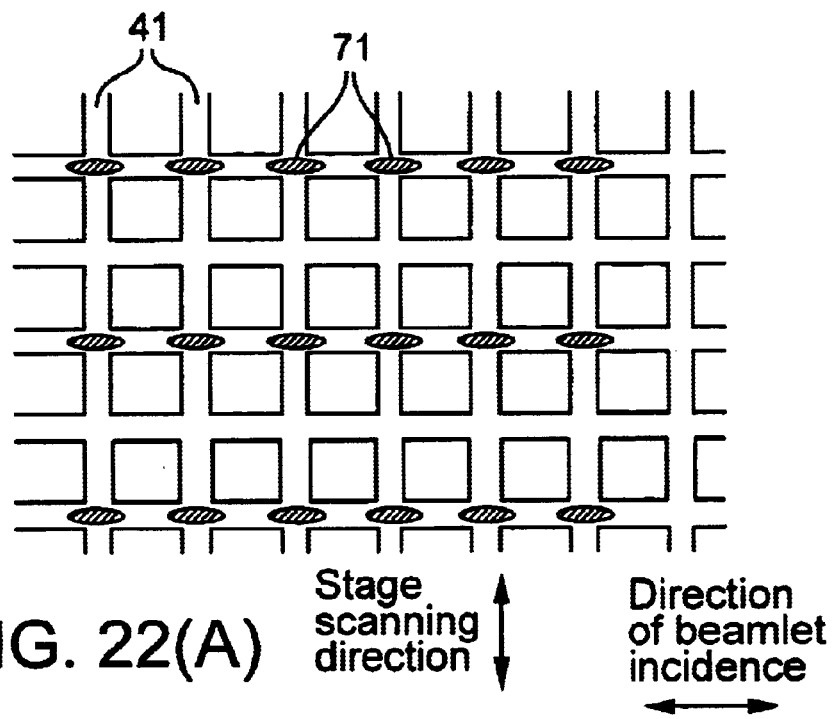
FIGS. 22(A)–22(B) are plan views that are similar to FIGS. 12(A)–12(B), respectively, except that the incident focus-detection beams in FIGS. 22(A)–22(B) extend in directions rotated 90 degrees from the directions shown in FIGS. 12(A)–12(B), respectively.
Figure 22B:
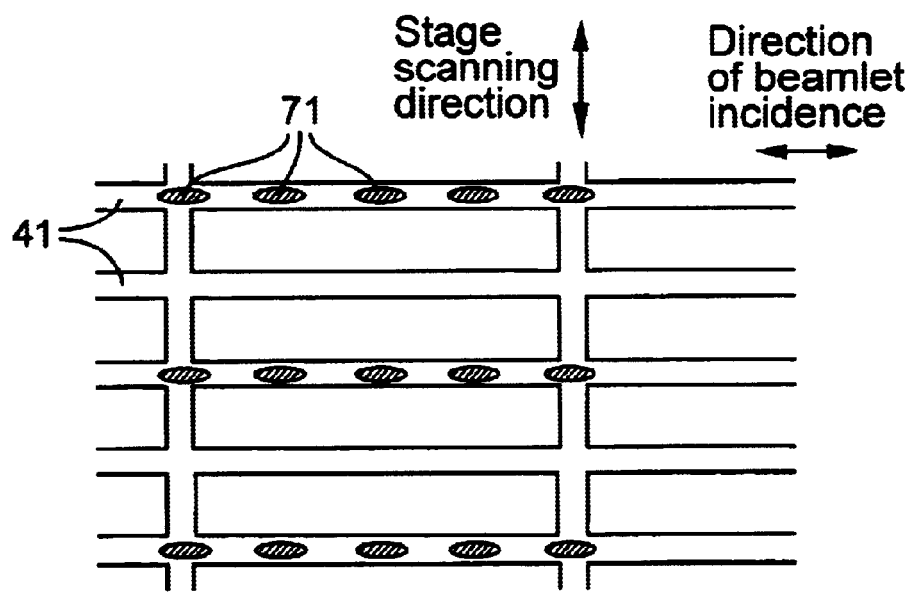

A way of solving this problem is shown in FIGS. 22(A) and 22(B), in which the orientation of the incident beamlets 71 is in a direction perpendicular to the stage-scanning direction (i.e., the beamlets are oriented left-to-right, or in the row direction, in the figure). A sufficient number of beamlets 71 are incident on the minor struts 41 to ensure accurate reticle-height detection. However, as the reticle stage and wafer stage move in the indicated stage-scanning directions, the beamlets 71 (or portions thereof) may be reflected by stenciled portions of the reticle membrane, resulting in erroneous height-detection data being produced. To avoid this problem, detections can be timed to occur only wherever the beams 71 are incident on the minor struts 41 shown.

For detecting the reflected one-dimensional beamlets 71, one-dimensional light-sensor arrays (e.g., one-dimensional CCDs) can be used, each corresponding to an individual beamlet. Alternatively, a two-dimensional light-sensor array (e.g., a two-dimensional CCD) can be used that simultaneously detects the multiple beamlets. Whichever type of light sensor is employed for situations in which reticle-height measurements are performed using one-dimensional beamlets arranged in multiple rows, it is housed in the height detector 134.

This aspect of the invention is described further below in the context of the AF-detection light 132 and the height-detection loci PA1–PA5, PB1–PB5, PC1–PC5, with reference to FIG. 23, depicting a plan view of a reticle R2 as viewed from upstream. The height-detection loci PA1–PA5, PB1–PB5, PC1–PC5 are located on respective one-dimensional minor row struts RCG2, RCG3, RCG1 of the reticle R2. Respective beamlets of AF-detection light 132 are incident on the height-detection loci PA1–PA5, PB1–PB5, PC1–PC5. Thus, the reticle-focus-detection mechanism 103 detects the "heights" HG of the one-dimensional minor struts RCG of the reticle R2.

The composition of the detection beamlets is as described above. Referring back to FIG. 15, the reticle-focus-detection mechanism 103 is described. Beamlets of the AF-detection light 132 are regularly reflected by the row minor strut surfaces RGP. This AF-reflected light is referred to as item 133 in the figure. This AF reflected light 133 is an aggregate of the light of the multiple beamlets LA1–LA5, LB1–LB5, LC1–LC5 reflected from the row minor strut surfaces RGP. The AF reflected light 133 enters the height-detection system 134 that is configured to detect the "heights" HG of the minor strut surfaces GP on the basis of the AF reflected light 133. The height-detection system 134 is described below with reference to FIGS. 24–29.

Figure 24:
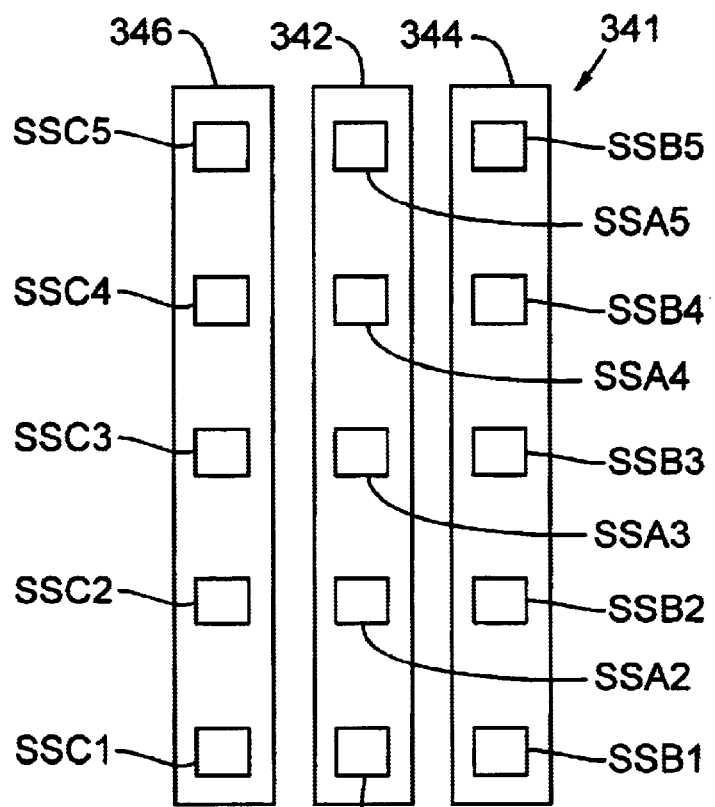
FIG. 24 is a plan view of the light-receiving surface with which the height-detection system shown in FIG. 15 receives AF-reflected light from a reticle, as discussed in connection with the fourth representative embodiment.

FIG. 24 depicts the light-receiving surface 341 with which the height-detection system 134 receives the AF-reflected light 133. Disposed on the light-receiving surface 341 are a main light-receiving portion 342 and first and second auxiliary light-receiving portions 344, 346, respectively. The position where the main light-receiving portion 342 is disposed is designated as a "main light-receiving position 343", and the respective positions where the first and second auxiliary light-receiving portions 344, 346 are disposed are designated as "auxiliary light-receiving positions" 345, 347, respectively. The main light-receiving portion 342 is configured to receive AF-reflected light 133 from the height-detection loci PA1–PA5. Specifically, the main light-receiving part 342 receives the AF-reflected light 133 from the vicinities of subfields SF illuminated by the illumination system 12. For detecting AF-reflected light 133 from the height-position loci PA1–PA5, the main light-receiving portion 342 comprises respective photosensors SSA1–SSA5. The first auxiliary light-receiving portion 344 is configured to receive AF-reflected light 133 from the height-detection loci PB1–PB5. Specifically, the first auxiliary light-receiving portion 344 receives the AF-reflected light 133 from the vicinities of subfields SF that are adjacent (in a first direction in the column direction) to the subfields SF illuminated by the illumination system 12. For detecting AF-reflected light from the height-position loci PB1–PB5, the first auxiliary light-receiving portion 344 comprises respective photosensors SSB1–SSB5. The second auxiliary light-receiving portion 346 is configured to receive the AF-reflected light 133 from the height-position loci PC1–PC5. Specifically, the second auxiliary light-receiving portion 346 receives the AF-reflected light 133 from the vicinities of subfields SF that are adjacent (in a second direction, opposite the first direction, in the column direction) to the subfields SF illuminated by the illumination system 12. For detecting AF-reflected light from the height-position loci PC1–PC5, the second auxiliary light-receiving portion 346 comprises respective photosensors SSC1–SSC5.

The height-detection system 134 is configured to determine the respective "heights" HG of the minor strut surfaces GP located at the respective height-detection loci PA1–PA5, according to calculations performed using data output by the respective photosensors SSA1–SSA5. Similarly, the height-detection system 134 is configured to determine the "heights" HG of the minor strut surfaces GP located at the respective height-detection loci PB1–PB5 and PC1–PC5, according to calculations performed using data output by the respective photosensors SSB1–SSB5 and SSC1–SSC5.

Figure 25:
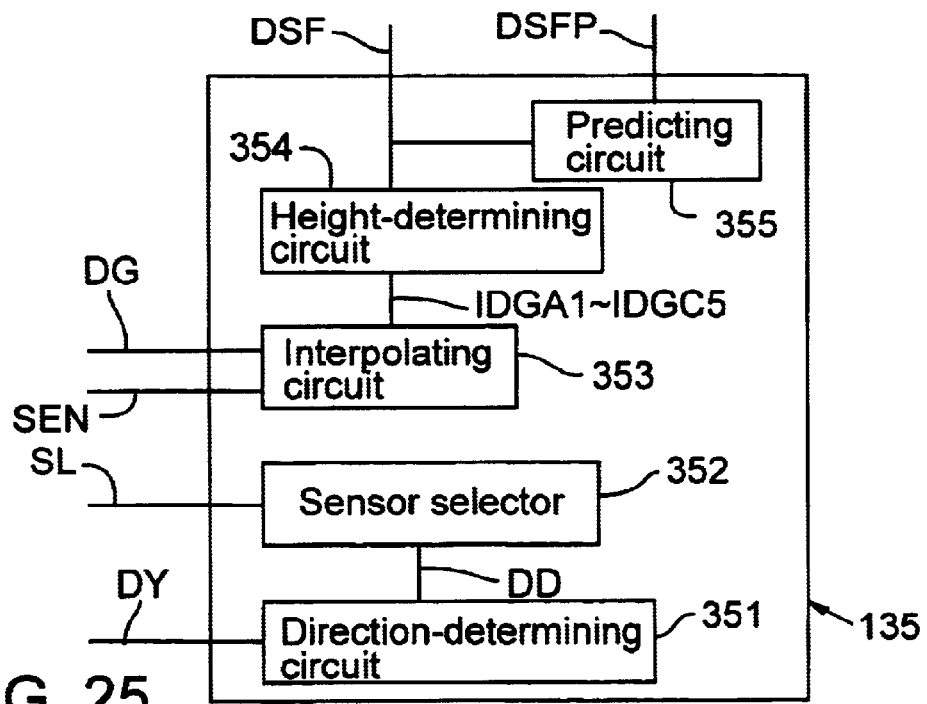
FIG. 25 is a block diagram showing certain functions of the processor shown in FIG. 15, as discussed in connection with the fourth representative embodiment.

Turning to FIG. 25, a "select" signal SL is used by the height-detection system 134 to select one of the auxiliary light-receiving portions 344, 346 to provide "height" data along with the main light-receiving portion 342. Thus, two sets of height-detection data can be output by the height-detection system 134, based on the select signal SL as the reticle stage moves in the positive Y-direction. For example, as the reticle stage moves in the positive Y-direction, the respective select signal SL results in selection of the first auxiliary light-receiving portion 344. The resulting sets of data output by the height-detection system 134 comprise a set of height data DG regarding the "heights" HG of the loci PA1–PA5 and a set of height data DG regarding the "heights" HG of the loci PB1–PBS. Alternatively, as the reticle stage moves in the negative Y-direction, the respective select signal SL results in selection of the second auxiliary light-receiving portion 346. The resulting sets of data output by the height-detection system 134 comprise a set of height data DG regarding the "heights" HG of the loci PA1–PA5 and a set of height data DG regarding the "heights" HG of the loci PC1–PC5. The height data DG corresponding to the "heights" HG of the loci PA1–PA5 are designated as "height data DGA1–DGA5". Similarly, the respective height data DG corresponding to the "heights" HG of the loci PB1–PB5 and PC1–PC5 are designated as "height data DGB1–DGB5" and "height data DGC1–DGC5," respectively. The term "height data DG" is a collective designation of the height data DGA1–DGA5, DGB1–DGB5, and DGC1–DGC5.

Based on the height data DG, the processor 135 calculates the heights HSF of respective subfields SF. The processor 135 is described with reference to FIG. 25, which depicts in block form certain functions of the processor. The processor 135 comprises a direction-determining circuit 351, a sensor selector 352, an interpolating circuit 353, a height-determining circuit 354, and a predicting circuit 355.

The direction-determining circuit 351 determines the direction of movement of the reticle stage RS (in either the positive or negative Y-direction), based on interferometer data DY. For example, if the data DY increases in value with movement of the reticle stage RS, then the direction-determining circuit 351 determines that the reticle stage is moving in the positive Y-direction.

As the reticle stage RS moves in the positive Y-direction, it is as if illumination of the reticle is progressing in the negative Y-direction (i.e., the column direction). Accordingly, whenever the direction-determining circuit 351 determines that the reticle stage RS is moving in the positive Y-direction, the reticle R1 actually is moving in the column direction. Conversely, whenever the direction-determining circuit 351 determines that the reticle stage is moving in the negative Y-direction, the reticle R1 actually is moving a direction opposite the column direction. The direction-determining circuit 351 outputs direction data DD, corresponding to whether the reticle stage RS is moving in the positive Y-direction or the negative Y-direction, to the sensor selector 352. Alternatively to a direction-determining circuit, the direction of motion can be determined from data produced by an exposure sequencer, for example.

The sensor selector 352 outputs a select signal SL to the height-detection system 134. Whenever the direction data DD indicates movement of the reticle stage RS in the positive Y-direction, the select signal SL results in selection of the first auxiliary light-receiving portion 344. Whenever the direction data DD indicates movement of the reticle stage RS in the negative Y-direction, the select signal SL results in selection of the second auxiliary light-receiving portion 346.

As an alternative to using a sensor selector 352 that outputs a select signal SL, it is possible to employ a data selector 356 (FIG. 26) that selects height data DG on the basis of the direction data DD. In such a configuration, the height-detection system 134 may always output height data DG from the main light-receiving portion 342 and auxiliary light-receiving portions 344 and 346 regardless of the direction of movement of the reticle stage.

The interpolating circuit 353 performs calculations that interpolate the height data DG as required. More specifically, the interpolating circuit 353 interpolates between the two sets of data output by the height-detection system 134. In an instance in which the height-detection system 134 outputs height data DGA1–DGA5 and DGB1–DGB5 (reticle stage moving in the positive Y-direction), one of the interpolated sets of data is the height data DGA1–DGA5 and the other set is the height data DGB1–DGB5. In an instance in which the height-detection system 134 outputs height data DGA1–DGA5 and DGC1–DGC5 (reticle stage moving in the negative Y-direction), one of the interpolated sets of data is the height data DGA1–DGA5 and the other set is the height data DGC1–DGC5.

Figure 27:
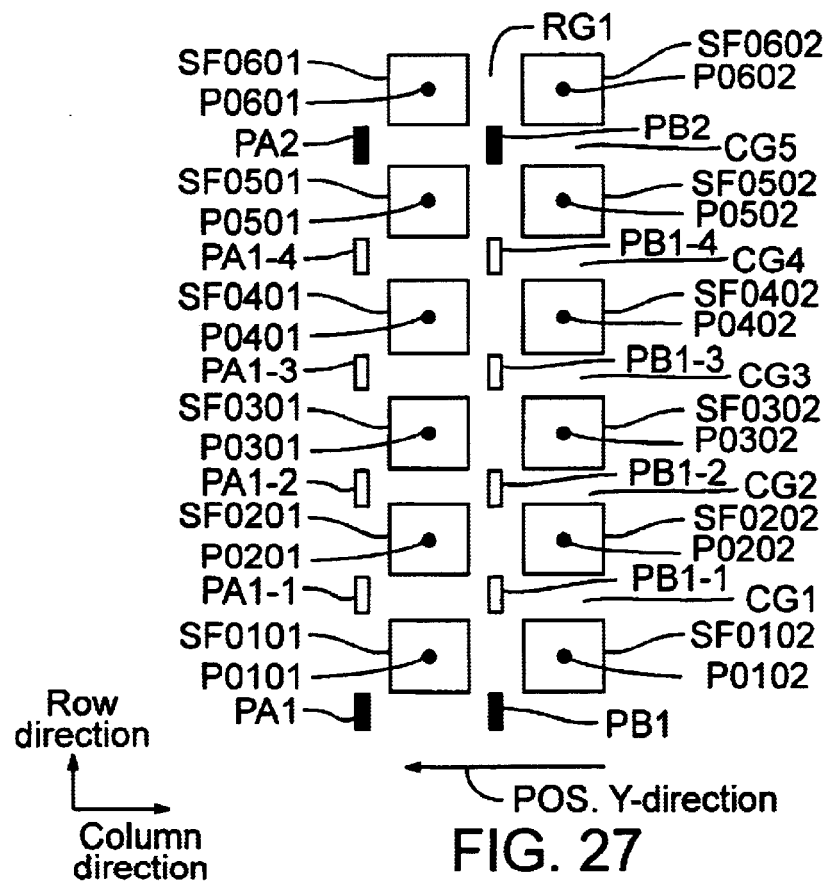
FIG. 27 is a plan view depicting certain aspects of operation of the interpolating circuit, as discussed in connection with the fourth representative embodiment.

The interpolating circuit 353 is described with reference to FIG. 27, using a case in which the interpolation is between the height data DGA1 and DGA2 as an example. FIG. 27 also shows subfields SF and the height-detection loci PA1, PA2, PB1, and PB2 (shaded). In the figure, the height-detection loci PB1 and PB2 are located on the row minor strut RG1. As described above, the height-detection locus PA1 is located at a respective end of the row minor strut RG adjacent the subfield SF0101. The height-detection locus PA2 is located on the column minor strut CG5. The subfields SF0101, SF0201, SF0301, SF0401, SF0501 and the column minor struts CG1, CG2, CG3, CG4, CG5 are located between the loci PA1 and PA2. In FIG. 27, the locations interpolated by the interpolating circuit 353 are the height-detection loci PA1-1, PA1-2, PA1-3, and PA1-4. These loci divide a line segment connecting the locus PA1 and the locus PA2 into five essentially equal parts. The height-detection loci PA1-1, PA1-2, PA1-3, and PA1-4 are respectively located on the column minor struts CG1, CG2, CG3 and CG4. Whenever an AF-enable signal SEN is input into the interpolating circuit 353, the interpolating circuit 353 determines the height data DGA1-1, DGA1-2, DGA1-3, and DGA1-4 for the loci PA1-1, PA1-2, PA1-3, and PA1-4, respectively. This calculation is performed by a linear interpolation from the height data DGA1 for the locus PA1 and the height data DGA2 for the locus PA2. The interpolating circuit 353 may determine the height data DGA1-1, DGA1-2, DGA1-3, and DGA1-4 not only from the height data DGA1 and DGA2, but also from the height data DGA1, DGA2, DGA3, DGA4, and DGA5. The interpolating circuit 353 outputs the height data DGA1, DGA1-1, DGA1-2, DGA1-3, DGA1-4, and DGA2. If the interpolating circuit 353 does not receive an AF-enable signal SEN, no linear interpolation is performed, and no height data DGA1, DGA1-1, DGA1-2, DGA1-3, DGA1-4, DGA2 are output from the interpolating circuit.

The strut detector 122 outputs an AF-enable signal SEN whenever the AF-detection light 132 reaches the row minor strut surfaces RGP. In such instances, the interpolating circuit 353 outputs the direct height data DGA1 and DGA2, as well as the interpolated height data DGA1-1, DGA1-2, DGA1-3, and DGA1-4 to the height-determining circuit 354. The interpolating circuit 353 also interpolates between the height data DGA2–DGA3, DGA3–DGA4, and DGA4–DGA5. Also, the interpolating circuit 353 interpolates between the height data DGB1–DGB2, DGB2–DGB3, DGB3–DGB4, and DGB4–DGB5, or alternatively between the height data DGC1–DGC2, DGC2–DGC3, DGC3–DGC4, and DGC4–DGC5. The direct and interpolated height data from DGA1 to DGA5 are denoted as respective "height data IDGA1, IDGA1-1, . . . , and IDGA5," respectively. Similarly, the direct and interpolated height data from DGB1 to DGB5 are denoted as respective "height data IDGB1, IDGB1-1, . . . , and IDGB5," respectively, and the direct and interpolated height data from DGC1 to DGC5 are denoted as "height data IDGC1, IDGC-1, . . . , IDGC5," respectively. The interpolating circuit 353 outputs the appropriate sets of direct and interpolated data to the height-determining circuit 354.

The height-determining circuit 354 determines the heights HSF of certain subfields SF by direct calculation (using direct data), and calculates the respective heights HSF of intervening subfields SF (using the interpolating data). Thus, the height-determining circuit 354 determines either the respective heights HSF of subfields SF that provided the direct and interpolated height data IDGA1–IDGA5 and IDGB1–IDGB5, or the respective heights HSF of subfields SF that provided the direct and interpolated height data IDGA1–IDGA5 and IDGC1–IDGC5. In other words, as the reticle stage moves in the positive Y-direction, the height-determining circuit 354 determines the respective heights HSF of subfields SF that produce the height data IDGA1–IDGA5 and IDGB1–IDGB5. As the reticle stage moves in the negative Y-direction, the height-determining circuit 354 determines the respective heights HSF of subfields SF that produce the height data IDGA1–IDGA5 and IDGC1–IDGC5.

In this regard, the height-determining circuit 354 is described with reference to FIG. 27, using a case in which the height HSF of the subfield SF0101 (located between the height-detection loci PA1 and PA1-1, and between the height-detection loci PB1 and PB1-1 for example. The position of the locus PA1 is indicated by the height data IDGA1, and the position of the locus PA1-1 is indicated by the height data IDGA1-1. The position of the height-detection locus PB1 is indicated by the height data IDGB1, and the position of the height-detection locus PB1-1 is indicated by the height data IDGB1-1.

The height-determining circuit 354 determines the position of the center P0101 of a rectangle (corresponding to the subfield SF0101) having respective corners at the loci PA1, PA1-1, PB1, and PB1-1. Accordingly, the center P0101 essentially coincides with the center of gravity of the subfield SF0101. The height-determining circuit 354 determines the mean of the height data IDGA1, IDGA1-1, IDGB1, and IDGB1-1. This mean is the height HSF of the subfield SF0101, and the position of this height HSF is the center P0101. Similarly, the height-determining circuit 354 determines the respective heights HSF of other subfields SF that produce data output by the interpolating circuit 353.

Figure 26:
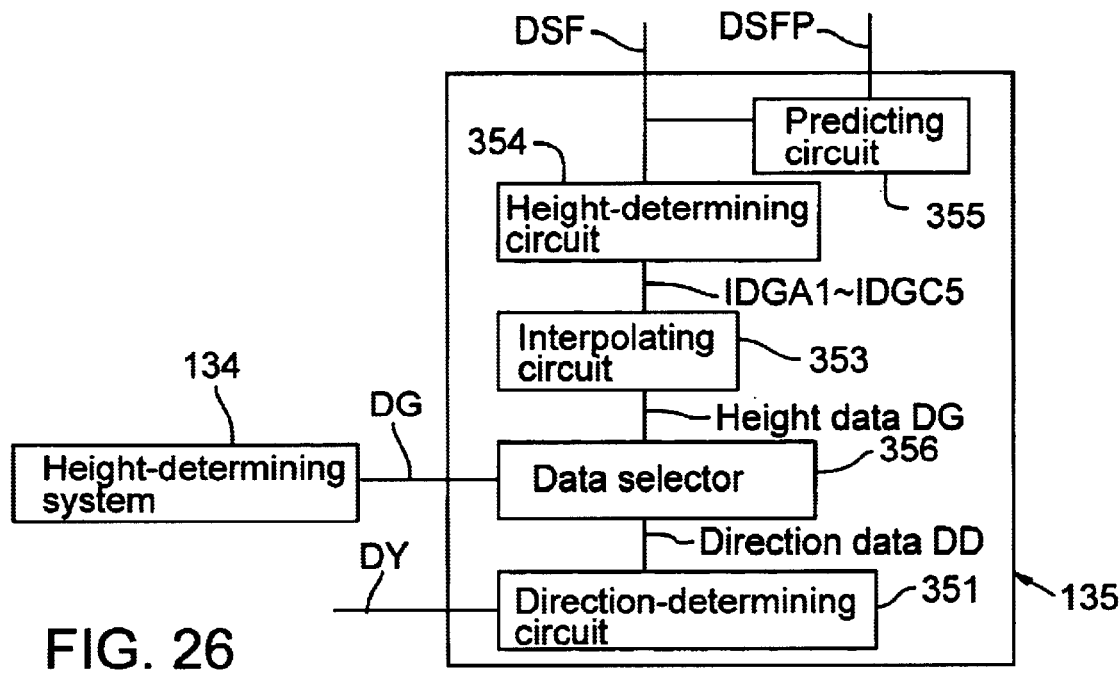
FIG. 26 is similar to FIG. 25, except that, in the processor configuration of FIG. 26, the sensor selector is replaced with a data selector, as discussed in connection with the fourth representative embodiment.

Returning the FIG. 26, the description of the processor 135 is continued. As described above, the interpolating circuit 353 outputs one of two sets of data, depending upon the direction of movement of the reticle stage RS. Thus, the height-determining circuit 354 also determines heights HSF based on the direction of reticle stage movement. The height-determining circuit 354 outputs height data DSF indicating respective heights HSF.

The predicting circuit 355 predicts, from multiple items of height data DSF, the heights HSFP of subfields SF that are situated adjacent one another in the column direction (subfields that produced the data DSF). Since the particular height data DSF that are output are based on the movement direction of the reticle stage, the predicting circuit 355 predicts the heights HSFP on the basis of movement direction of the reticle stage. Specifically, in cases in which the reticle stage moves in the positive y-direction, the predicting circuit 355 predicts the heights HSFP of subfields SF that are adjacent, in the negative Y-direction, to the subfields SF that produced the height data DSF. In cases in which the reticle stage moves in the negative Y-direction, the predicting circuit 355 predicts the heights HSFP of subfields SF that are adjacent, in the positive Y-direction to the subfields SF that produced the height data DSF.

Figure 28:
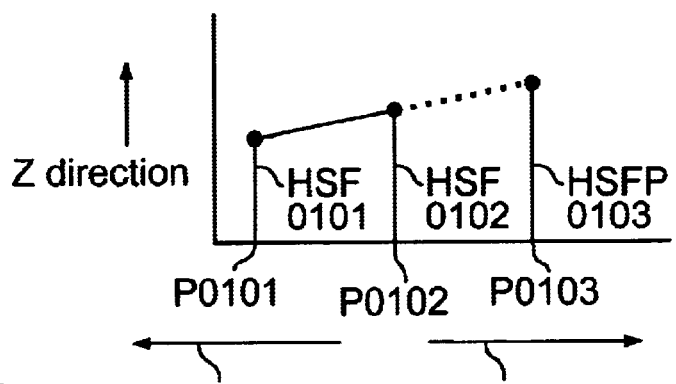
FIG. 28 is a plot of the relationship between two measured subfield "heights" and a third predicted subfield height, based on an extrapolation using a linear (first-order) function, as performed by the predicting circuit discussed in the fourth representative embodiment.
Figure 29:
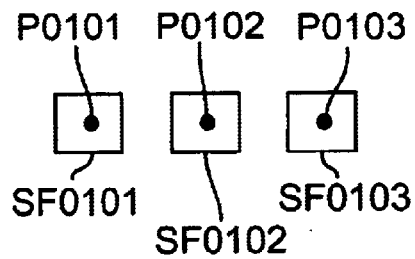
FIG. 29 is a plan view of the three subfields shown in FIG. 28, including the respective centers of the subfields.

The predicting circuit 355 is described with reference to FIGS. 28 and 29. In the depicted example, the predicted height HSFP of the subfield SF0103 (lined up in the negative Y-direction with respect to the subfield SF0101) is determined as the reticle stage moves in the positive Y-direction. FIG. 28 is a plot of the relationship between height HSF and predicted height HSFP. In the figure, HSF0101 is the height HSF of the subfield SF0101, HSF0102 is the height HSF of the subfield SF0102, and HSFP0103 is the predicted height HSFP of the subfield SF0103. FIG. 29 shows the subfields SF0101–SF0103. In FIG. 29, the center P0102 indicates the position of the height HSF0102 of the subfield SF0102, and the center P0103 indicates the position of the predicted height HSF0103 of the subfield SF0103. As indicated in FIG. 29, the subfield SF0103 is positioned farther in the negative Y-direction than the subfield SF0102 from the subfield SF0101. The predicting circuit 355 determines a first-order function that connects the height HSF0101 and the height HSF0102. The point at which this first-order function intersects the center P0103 is the predicted height HSFP0103 of the subfield SF0103.

The predicting circuit 355 is not limited to determining predicted heights HSFP from two heights HSF. The circuit 355 also may determine predicted heights HSFP from three or more HSF values using higher-order curves. Using higher-order curves is advantageous because the accuracy of the predicted height HSFP is increased over using linear plots. The predicting circuit 355 similarly determines the predicted heights HSFP of the subfields SF0202–SF2002, lined up in the negative Y-direction, for the subfields SF0201–SF2001.

Whenever the predicting circuit 355 thus determines the predicted heights HSFP based on the direction of movement of the reticle stage, the resulting height-prediction data DSFP (indicating the predicted heights HSFP) are output to the illumination system 12.

Returning to FIG. 15, the description of the illumination system 12 and the reticle-focus-detection mechanism 103 is continued. The illumination system 12 stores the height data DSF for the subfields SF of three rows of which the exposure is completed. However, the illumination system 12 is not limited to storing height data DSF for the subfields SF of three rows. Alternatively, the illumination system 12 can be configured to store height data DSF for the subfields SF of any number of rows, so long as the number of rows is two or more. The illumination system 12 determines (by calculation) a function that expresses a curve passing through the stored height data DSF and predicted-height data DSFP. A correction to reticle height, and/or to the illumination beam produced by the illumination system is performed in accordance with the determined curve.

The CPB microlithography apparatus 100 and its operation may now be summarized with reference to FIG. 13. The illumination beam IB illuminating the reticle 21 is patterned as the beam passes through the illuminated portion of the reticle. The resulting patterned beam PB propagates to the projection-lens system 23. The projection-lens system 23 projects the patterned beam PB onto the wafer 24. During such projection, the images of the subfields SF on the reticle 21, as projected onto the wafer 24, are "reduced" or "demagnified." Also, during such projection of successive subfields SF, the illumination beam IF and patterned beam PB are scanned in opposite directions in the X-direction. Meanwhile, the wafer 24 is held on the wafer stage 25, which moves in a direction opposite the direction of motion of the reticle stage 22.

After a reticle 21 is mounted onto the reticle stage 22 and a wafer 24 is mounted onto the wafer stage 25, exposure operation of the CPB microlithography apparatus 100 is initiated. The reticle stage 22 holds the reticle 21 such that a direction opposite the row direction of the reticle 21 is parallel to the positive Y-direction. At initiation of exposure, the reticle stage 22 moves the reticle 21 in the Y-direction as the source 111 emits the illumination beam IB. As the illumination beam IB passes through the illumination system 12, the subfields SF on the reticle 21 are illuminated successively as the illumination beam IB is scanned in the row direction.

The reticle-focus-detection mechanism 103 emits beamlets of AF-detection light 132 toward the reticle 21. The reticle-stage-detection device 102 detects the position of the reticle stage 21, and outputs corresponding interferometer data DY. Whenever the reticle stage 21 is in the detection-enable position PEN, the reticle-stage-detection device 102 outputs an AF-enable signal SEN. The reticle-focus-detection mechanism 103 determines the direction of movement of the reticle stage 21, either by inputting the interferometer data DY or based on data from an exposure sequencer. Whenever an AF-enable signal SEN is input to the reticle-focus-detection mechanism 103, and the direction of movement of the reticle stage 21 is the positive Y-direction, the reticle-focus-detection mechanism 103 determines the heights HSF of the subfields SF illuminated by the illumination system 12. The reticle-focus-detection mechanism 103 also determines the predicted heights HSFP of the subfields SF adjacent in the negative Y-direction to these subfields SF. These determinations are made based on AF-reflection light 133 from the height-detection loci PA1–PA5 and PB1–PB5. Whenever an AF-enable signal SEN is input to the reticle-focus-detection mechanism 103, and the direction of movement of the reticle stage is the negative Y-direction, the reticle-focus-detection mechanism 103 determines the heights HSF of the subfields SF illuminated by the illumination system 12. The reticle-focus-detection mechanism 103 also determines the predicted heights HSFP of the subfields SF adjacent in the positive Y-direction to these subfields SF. These determinations are made based on AF-reflection light 133 from the height-detection loci PA1–PA5 and PC1–PC5. The reticle-focus-detection mechanism 103 outputs height data DSF indicating the heights HSF, as well as the height-prediction data DSFP indicating the predicted heights HSFP.

The illumination system 12 corrects the illumination beam IB so that various types of distortion and various types of aberration of the beam are minimized at the height indicated by the height data DSF. The illumination system 12 also corrects the illumination beam IB along a curve passing through the height data DSF and the height-prediction data DSFP stored in a memory.

The illumination beam IB illuminating the reticle 21 is patterned by passage through the illuminated region of the reticle 21. The resulting patterned beam PB propagates to the projection-lens system 23. The projection-lens system 23 reduces (demagnifies) the images of the reticle subfields SF as projected onto the wafer 24, while scanning the patterned beam PB in the X-direction opposite to the scanning direction of the illumination beam IB. Meanwhile, the wafer stage 25 moves the wafer 24 in a direction opposite to the direction in which the reticle stage 22 moves. Hence, the reticle pattern is projected onto the wafer 24.

As an example of focus control, and referring to FIG. 5, focus detection of the reticle R can be performed using the output of the height detector 5 receiving the reticle-focus-detection beam 6. In such a scheme, the output from the sensor is fed back to control one or more vertical actuators 2. To correct any residual difference, the focus of the projection lens LC can be caused to track the correct value by means of dynamic focus control in which the respective currents flowing to respective coils in the columns LC, UC are controlled. To achieve this control, an output signal from the reticle-focus height detector 5 and an output signal from the wafer-focus height detector 8 are received by a processor. Data regarding the detected positions of the stages 1, 25 are received from the respective distance-measuring interferometer systems. Height-position-correction amounts for the subfields on the reticle 21 and wafer-focus correction amounts are determined. During exposure, actuator control of both the reticle 21 and the wafer 24, and dynamic focus control of the CPB-optical components in the columns UC, LC are performed on the basis of the output of the correction calculations.

Fifth Representative Embodiment

Figure 30:
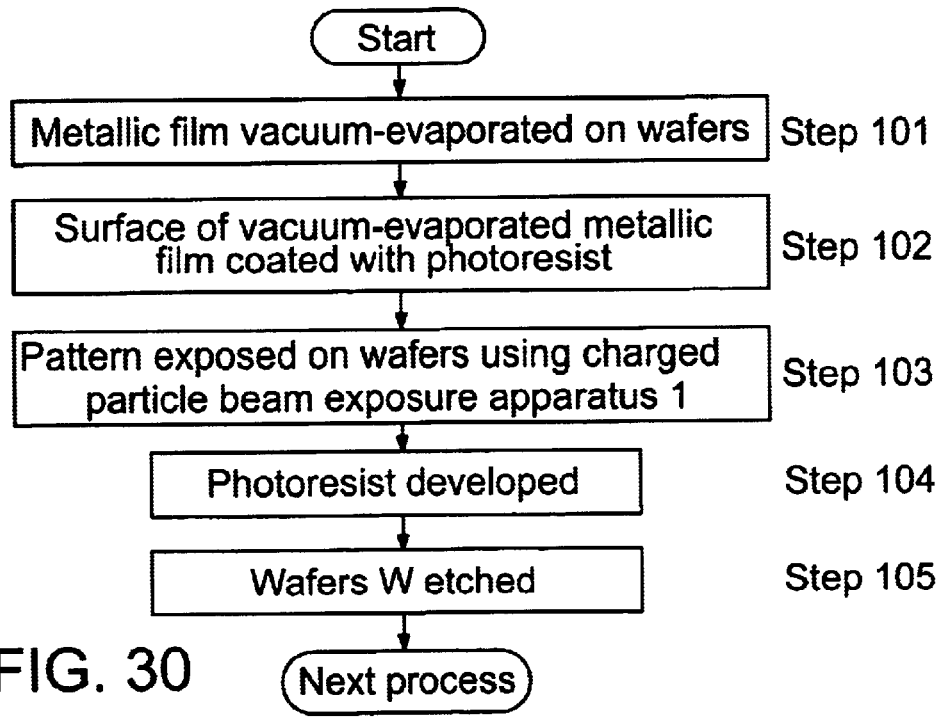
FIG. 30 is a block diagram of certain steps in a method for manufacturing a microelectronic device, involving a microlithography step, as described in the fifth representative embodiment.

This embodiment is directed to a microelectronic-device manufacturing method, including a microlithography step using a CPB microlithography apparatus as described herein, as shown in FIG. 30.

In Step 101, a metal film is deposited on the wafer W.

In Step 102, a photoresist is applied to the metal film deposited on the wafer W.

In Step 103, the elements of a pattern defined by a reticle R are exposed sequentially onto the wafer W using the CPB microlithography apparatus.

In Step 104, the photoresist (with imprinted pattern) is developed.

In Step 105, the wafer W is etched using the developed resist as a mask. During etching, elements corresponding to the features of the pattern defined by the reticle R are formed on the wafer W.

After completing Step 105, other circuits (layers) can be formed on the wafer W as required atop the layer formed in Steps 101–105, until manufacture of the respective microelectronic devices on the wafer W is completed.

Hence, according to the invention, reticle-focus-detection devices and methods are provided for use in CPB microlithography. The reticle-focus-detection device provides an array of multiple focus-detection beamlets that are incident at an oblique angle on the reticle. Light of the beamlets reflected from the reticle is detected by a sensor operable to determine respective positions of the reflected beamlets. From the resulting beam-position data, data is obtained regarding the axial height position of the reticle relative to the projection-lens system. Obtaining of the reticle-position data can be synchronized so that the data is obtained only whenever minor struts of the reticle are coincident with the respective positions of the focus-detection beamlets. Such synchronization prevents erroneous position signals that otherwise might be produced whenever, for example, the reticle is a stencil reticle. As the beams are reflected from the reticle, variations in axial height position of the reticle relative to the projection-lens system are detected as variations in the positions of the beamlets as incident on the sensor. To such end, the sensor can be split into multiple portions (configured as a two-dimensional sensor) or can be a one-dimensional (linear) sensor. The reticle-focus detection can be performed at high speed and with high stability regardless of the direction of movement of the reticle stage.

Whereas the invention has been described in connection with a preferred embodiment, it will be understood that the invention is not limited to that embodiment. On the contrary, the invention is intended to encompass all modifications, alternatives, and equivalents as may be included within the spirit and scope of the invention, as defined by the appended claims.

What is claimed is:

1. A charged-particle-beam (CPB) microlithography apparatus, comprising:
    an illumination system situated and configured to illuminate a region of a pattern-defining reticle with a charged-particle illumination beam passing through the illumination system;
    a projection system situated and configured to projection-transfer an image of the illuminated region of the reticle onto a corresponding region of a sensitive substrate using an imaging beam passing through the projection system; and
    a reticle-focus-detection device situated and configured to detect an axial height position of the reticle relative to the projection system.

2. The apparatus of claim 1, wherein the reticle-focus-detection device is configured to detect an axial height position of a stencil reticle relative to the projection system.

3. The apparatus of claim 1, wherein the reticle-focus-detection device is configured to detect an axial height position of a scattering-membrane reticle relative to the projection system.

4. The apparatus of claim 1, wherein the reticle-focus-detection device comprises:
    a focus-detection-beam source situated and configured to produce a focus-detection light beam and to direct the focus-detection beam onto a surface of the reticle such that the focus-detection beam is incident on the reticle at an oblique angle of incidence; and
    a height detector situated and configured to detect light, of the focus-detection beam, reflected from the reticle surface and to produce a corresponding focus-detection signal.

5. The apparatus of claim 4, wherein:
    the reticle comprises a reticle membrane and support struts extending from non-pattern-defining regions of the reticle membrane; and
    the focus-detection-beam source is configured to produce multiple focus-detection light beams directed at the reticle surface in a manner in which the focus-detection light beams are incident on the non-pattern-defining regions of the reticle membrane.

6. The apparatus of claim 5, wherein the reticle-focus-beam source is configured to direct the focus-detection beams to the reticle, and the height detector is configured to produce the focus-detection signal, only whenever the non-pattern-defining regions of the reticle membrane are being illuminated by the focus-detection beams.

7. The apparatus of claim 1, further comprising a reticle stage to which the reticle is mounted and a substrate stage to which the substrate is mounted for exposure, wherein the reticle stage and substrate stage are moved in opposite directions during exposure of the reticle pattern onto the substrate.

8. The apparatus of claim 7, wherein the focus-detection-beam source is configured to produce multiple focus-detection-light beamlets directed at the reticle surface.

9. The apparatus of claim 8, wherein the multiple beamlets are incident on the reticle surface in a direction that is perpendicular to a reticle-scanning direction.

10. A process for manufacturing a microelectronic device, comprising:
    depositing a layer on a wafer;
    applying a resist to the layer;
    exposing a pattern onto the resist using a CPB microlithography apparatus as recited in claim 1;
    developing the resist; and
    etching the layer.

11. In a method for performing projection-transfer of a pattern, defined on a reticle, to a sensitive substrate using a charged particle beam, wherein the reticle is illuminated with a charged-particle illumination beam to produce an imaging beam, and the imaging beam is passed through a projection system to the substrate, a method for detecting a focus condition of the reticle, the method comprising:
    (a) providing a focus-detection beam of light directed at an oblique angle of incidence to a surface of the reticle to produce a reflected beam;
    (b) detecting the reflected beam using a height detector configured to produce a corresponding detection signal from the detected light; and
    (c) processing the detection signal to produce data concerning an axial height position of the reticle relative to the projection system.

12. The method of claim 11, wherein:
    the reticle comprises a reticle membrane and support struts extending from non-pattern-defining regions of the reticle membrane; and
    step (a) comprises providing multiple focus-detection-light beamlets directed at the reticle surface in a manner in which the focus-detection-light beamlets are incident on the non-pattern-defining regions of the reticle membrane.

13. The method of claim 11, wherein:
    the reticle includes non-pattern-defining regions of the reticle membrane; and
    steps (a) and (b) are performed whenever the non-pattern-defining regions of the reticle membrane are being illuminated by the focus-detection beams.

14. The method of claim 11, wherein the focus-detection-light beamlets are incident on the reticle surface at a direction that is perpendicular to a reticle-scanning direction.

15. A charged-particle-beam (CPB) microlithography method, comprising a method for detecting a focus condition of the reticle as recited in claim 11.

16. A process for manufacturing a microelectronic device, comprising:
    depositing a layer on a wafer;
    applying a resist to the layer;
    exposing a pattern onto the resist using a CPB microlithography method as recited in claim 15;

developing the resist; and etching the layer.

17. A charged-particle-beam (CPB) microlithography apparatus, comprising:

an illumination system situated and configured to illuminate a region of a pattern-defining reticle with a charged-particle illumination beam passing through the illumination system;

a projection system situated and configured to projection-transfer an image of the illuminated region of the reticle onto a corresponding region of a sensitive substrate using an imaging beam passing through the projection system; and a reticle-focus-detection device situated and configured to detect an axial height position of the reticle relative to the projection system, the reticle-focus-detection device comprising (i) a focus-detection-beam source situated and configured to produce a focus-detection light beam and to direct the focus-detection beam onto a surface of the reticle such that the focus-detection beam is incident on the reticle at an oblique angle of incidence, and (ii) a height detector situated and configured to detect light, of the focus-detection beam, reflected from the reticle surface and to produce a corresponding focus-detection signal, the height detector comprising a light-receiving surface and being configured to measure a lateral displacement of the focus-detection light beam on the light-receiving surface.

18. The apparatus of claim 17, wherein the height detector comprises a light sensor selected from the group consisting of one-dimensional light-sensor arrays, two-dimensional light-sensor arrays, and point-sensitive detectors.

19. The apparatus of claim 17, wherein the focus-detection-beam source is configured to produce, from the focus-detection light beam, multiple focus-detection beamlets, and to direct the focus-detection beamlets onto respective height-detection loci on the surface of the reticle.

20. The apparatus of claim 16, wherein:

the reticle comprises support struts having respective edge surfaces; and the height-detection loci are located on the edge surfaces of the support struts, the loci being spaced from each other at an equal locus-spacing interval in a direction perpendicular to a reticle-scanning direction.

21. The apparatus of claim 17, wherein:

the support struts are spaced from each other at a strut-spacing interval in the reticle-scanning direction; and the locus-spacing interval is an integral multiple of the strut-spacing interval.

22. A process for manufacturing a microelectronic device, comprising:

depositing a layer on a wafer;

applying a resist to the layer;

exposing a pattern onto the resist using a CPB microlithography apparatus as recited in claim 12;

developing the resist; and etching the layer.

23. In a charged-particle-beam (CPB) microlithography apparatus including an illumination system that illuminates a region of a pattern-defining reticle with a charged-particle illumination beam passing through the illumination system, and a projection system that projection-transfers an image of the illuminated region of the reticle onto a corresponding region of a sensitive substrate using an imaging beam passing through the projection system, a reticle-focus-detection device that detects an axial height position of the reticle relative to the projection system, the reticle-focus-detection device comprising:

a focus-detection-beam source situated and configured to produce multiple separate beamlets of focus-detection light and to direct the beamlets at an oblique angle of incidence onto a surface of the reticle, such that the beamlets are incident at respective height-detection loci on the surface of the reticle; and a height detector situated and configured to detect light of the beamlets reflected from the reticle surface and to produce a corresponding focus-detection signal, the height detector comprising a light-receiving surface including a respective light detector for each beamlet, each light detector being configured to measure a lateral displacement of the respective beamlet on the light-receiving surface and produce a respective height-encoding signal.

24. The reticle-focus-detection device of claim 23, wherein:

the focus-detection-beam source is configured to produce at least three beamlets that are incident at respective height-detection loci arranged on the reticle surface relative to an exposure region of the reticle surface that can be illuminated by a corresponding deflection of the illumination beam; and the height detector is further configured to produce an aggregate signal from the respective height-encoding signals produced by the respective light detectors for the at least three beamlets, the aggregate signal corresponding to a height measured at a center of the exposure region.

25. The reticle-focus-detection device of claim 24, wherein:

the exposure region includes opposing ends each including multiple height-detection loci; and the focus-detection beam source is further configured to produce a respective beamlet for each height-detection locus at each end.

26. The reticle-focus-detection device of claim 23, wherein:

the reticle comprises support struts having respective edge surfaces; and the height detector is further configured to detect respective beamlets reflected from height-detection loci located on the edge surfaces of the support struts, the loci being spaced from each other at an equal locus-spacing interval in a direction perpendicular to a reticle-scanning direction.

27. The reticle-focus-detection device of claim 26, wherein:

the support struts are spaced from each other at a strut-spacing interval in the reticle-scanning direction; and the locus-spacing interval is an integral multiple of the strut-spacing interval.

28. The reticle-focus-detection device of claim 23, wherein:

the reticle comprises support struts having respective edge surfaces; and the height detector is further configured to detect respective beamlets reflected from height-detection loci located on the edge surfaces of the support struts, the loci being spaced from each other at an equal locus-spacing interval in the reticle-scanning direction.

29. The reticle-focus-detection device of claim 28, wherein:
the support struts are spaced from each other at a strut-spacing interval in a direction perpendicular to the reticle-scanning direction; and
the locus-spacing interval is an integral multiple of the strut-spacing interval.

30. The reticle-focus-detection device of claim 29, wherein the locus-spacing interval is an integral multiple of one-half the strut-spacing interval.

31. The reticle-focus-detection device of claim 23, further comprising a processor to which the light detectors of the height detector are connected, the processor being configured to calculate respective heights of the height-detection loci, based on the respective height-encoding signals.

32. The reticle-focus-detection device of claim 31, wherein the processor further comprises an interpolating circuit configured to calculate respective interpolated heights of locations situated between flanking height-detection loci, the interpolated heights being calculated based on the respective height-encoding signals from the flanking height-detection loci.

33. The reticle-focus-detection device of claim 32, wherein the interpolating circuit is further configured to calculate respective interpolated heights of locations, situated between flanking height-detection loci, lined up in a direction perpendicular to a reticle-scanning direction.

34. The reticle-focus-detection device of claim 33, wherein:
the reticle is segmented into multiple subfields; and
at least one of the locations at which interpolated heights are calculated is situated adjacent a respective subfield of the reticle.

35. The reticle-focus-detection device of claim 31, wherein:
the reticle comprises multiple subfields, wherein at least some of the subfields are flanked by respective multiple height-detection loci; and
the processor further comprises a height-determining circuit configured to calculate respective heights of the subfields based on determined heights of the respective flanking height-detection loci.

36. The reticle-focus-detection device of claim 35, wherein the processor further comprises a predicting circuit configured to predict respective heights of subfields lined up in a direction perpendicular to a reticle-scanning direction, the predictions being based on the heights of subfields calculated by the height-determining circuit.

37. The reticle-focus-detection device of claim 23, wherein:
the light-receiving surface constitutes a main light-receiving portion of the height detector; and
the main light-receiving portion is situated so as to receive beamlets reflected from locations, on the reticle surface, at which respective height detections are determined.

38. The reticle-focus-detection device of claim 37, wherein the height detector further comprises multiple auxiliary light-receiving portions each situated so as to receive respective beamlets reflected from locations, on the reticle surface, at which respective height detections are to be determined.

39. The reticle-focus-detection device of claim 38, wherein the auxiliary light-receiving portions are situated and configured to receive respective beamlets reflected from locations, on the reticle surface, that are displaced in a reticle-scanning direction from locations detected by the main light-receiving portion.

40. The reticle-focus-detection device of claim 38, further comprising a processor to which the light detectors of the height detector are connected, the processor being configured to calculate respective heights of the height-detection loci, based on the respective height-encoding signals, the processor further comprising a direction-determining circuit configured to detect a direction of scanning movement of the reticle.

41. The reticle-focus-detection device of claim 40, wherein the processor further comprises a sensor selector configured to select a respective auxiliary light-receiving portion based on the respective direction of scanning movement of the reticle as detected by the direction-determining circuit.

42. The reticle-focus-detection device of claim 23, further comprising a stage-detection device situated and configured to detect a position of the reticle stage.

43. The reticle-focus-detection device of claim 42, wherein the stage-detection device is further configured to detect a detection-enable position of the reticle stage and to output an AF-enable signal to the height detector whenever the reticle stage is in the detection-enable position.

44. The reticle-focus-detection device of claim 43, wherein the height detector is further configured to produce the focus-detection signals upon receiving the AF-enable signal.

45. The reticle-focus-detection device of claim 43, wherein the detection-enable position corresponds to a reticle-stage position at which the beamlets are incident on the respective light-receiving loci.

46. The reticle-focus-detection device of claim 45, wherein:
the reticle comprises support struts having respective edge surfaces; and
the detection-enable position corresponds to the reticle-stage position at which the beamlets are incident on respective light-receiving loci situated on edge surfaces of the support struts.

47. The reticle-focus-detection-device of claim 23, wherein the beamlets are incident on the reticle surface at an incidence direction that is perpendicular to a reticle-scanning direction.

48. A charged-particle-beam (CPB) microlithography apparatus, comprising the reticle-focus-detection device of claim 23.

49. A process for manufacturing a microelectronic device, comprising:
depositing a layer on a wafer;
applying a resist to the layer;
exposing a pattern onto the resist using a CPB microlithography apparatus as recited in claim 48;
developing the resist; and
etching the layer.

50. In a method for performing projection-transfer of a pattern, defined on a reticle, to a sensitive substrate using a charged particle beam passing through a charged-particle-beam (CPB) optical system, wherein a region of the reticle is illuminated with a charged-particle illumination beam to produce an imaging beam that forms an image of the illuminated region on the substrate, a method for detecting a focus condition of the reticle, the method comprising:
(a) providing a reticle segmented into multiple subfields arrayed in a two-dimensional array and separated from one another by support struts;

(b) mounting the reticle on a reticle stage movable at least in a stage-scanning direction;

(c) detecting a position of the reticle stage;

(d) while the reticle stage is at a detected position, providing a focus-detection beam of light directed at an oblique angle of incidence to a surface of the reticle to produce a reflected beam;

(e) detecting light of the reflected focus-detection beam using a height detector configured to produce a corresponding detection signal from the detected light;

(f) processing the detection signal to produce data concerning an axial height position of the reticle relative to the CPB optical system; and (g) if the axial height position of the reticle is outside pre-set tolerance limits, then applying a correction to at least one of the axial height position and the CPB optical system until the axial height position is within the tolerance limits.

51. A charged-particle-beam (CPB) microlithography method, comprising a method for detecting a focus condition of the reticle as recited in claim 50.

52. A process for manufacturing a microelectronic device, comprising:

depositing a layer on a wafer;

applying a resist to the layer;

exposing a pattern onto the resist using a CPB microlithography method as recited in claim 51;

developing the resist; and etching the layer.

* * * * *

UNITED STATES PATENT AND TRADEMARK OFFICE
CERTIFICATE OF CORRECTION

PATENT NO. : 6,768,124 B2
DATED : July 27, 2004
INVENTOR(S) : Suzuki et al.

It is certified that error appears in the above-identified patent and that said Letters Patent is hereby corrected as shown below:

Column 12,
Line 39, "and row C." should read -- and row C.) --.

Column 23,
Line 19, "PB1-PBS." should read -- PB1-PB5. --.

Column 25,
Line 63, "returning the" should read -- returning to --

Column 26,
Line 12, "y-direction," should read -- Y-direction, --

Column 27,
Line 14, "beam IF" should read -- beam IB --.

Column 31,
Line 40, "of claim 16," should read -- of claim 19, --.
Line 40, "of claim 17," should read -- of claim 20, --.
Line 58, "in claim 12;" should read -- in claim 17; --.

Signed and Sealed this

Fifteenth Day of February, 2005

JON W. DUDAS
*Director of the United States Patent and Trademark Office*